US010749109B2

(12) United States Patent
Howard et al.

(10) Patent No.: US 10,749,109 B2
(45) Date of Patent: Aug. 18, 2020

(54) READ OUT INTEGRATED CIRCUIT (ROIC) FOR RAPID TESTING AND CHARACTERIZATION OF RESISTIVITY CHANGE OF HEATING ELEMENT IN PHASE-CHANGE MATERIAL (PCM) RADIO FREQUENCY (RF) SWITCH

(71) Applicant: Newport Fab, LLC, Newport Beach, CA (US)

(72) Inventors: David J. Howard, Irvine, CA (US); Gregory P. Slovin, Irvine, CA (US); Nabil El-Hinnawy, Irvine, CA (US)

(73) Assignee: Newport Fab, LLC, Newport Beach, CA (US)

( * ) Notice: Subject to any disclaimer, the term of this patent is extended or adjusted under 35 U.S.C. 154(b) by 0 days.

(21) Appl. No.: 16/546,149

(22) Filed: Aug. 20, 2019

(65) Prior Publication Data

US 2020/0058868 A1    Feb. 20, 2020

Related U.S. Application Data

(63) Continuation-in-part of application No. 16/103,490, filed on Aug. 14, 2018, now Pat. No. 10,476,001, and
(Continued)

(51) Int. Cl.
*H01L 45/00*    (2006.01)
*H03K 17/18*    (2006.01)
(Continued)

(52) U.S. Cl.
CPC ...... *H01L 45/1286* (2013.01); *G01R 31/2834* (2013.01); *G01R 31/3277* (2013.01); *H01L 45/06* (2013.01); *H03K 17/18* (2013.01)

(58) Field of Classification Search
None
See application file for complete search history.

(56) References Cited

U.S. PATENT DOCUMENTS 6,894,305 B2    5/2005    Yi
7,522,029 B1    4/2009    Lantz
(Continued)

FOREIGN PATENT DOCUMENTS

WO    WO 2016/028362    2/2016

OTHER PUBLICATIONS

G. Slovin, et al., "Design Criteria in Sizing Phase-Change RF Switches," in *IEEE Transactions on Microwave Theory and Techniques*, vol. 65, No. 11, pp. 4531-4540, Nov. 2017.
(Continued)

*Primary Examiner* — Evren Seven
(74) *Attorney, Agent, or Firm* — Farjami & Farjami LLP

(57) ABSTRACT

A rapid testing read out integrated circuit (ROIC) includes phase-change material (PCM) radio frequency (RF) switches residing on an application specific integrated circuit (ASIC). Each PCM RF switch includes a PCM and a heating element transverse to the PCM. The ASIC is configured to provide amorphizing and crystallizing electrical pulses to a selected heating element in a selected PCM RF switch. The ASIC is also configured to generate data for determining and characterizing resistivity change of the selected heating element in the selected PCM RF switch after the ASIC performs a plurality of OFF/ON cycles. In one implementation, a testing method using the ASIC is disclosed.

20 Claims, 10 Drawing Sheets

Related U.S. Application Data a continuation-in-part of application No. 16/103,587, filed on Aug. 14, 2018, now Pat. No. 10,461,253, and a continuation-in-part of application No. 16/103,646, filed on Aug. 14, 2018, now Pat. No. 10,475,993, and a continuation-in-part of application No. 16/114,106, filed on Aug. 27, 2018, and a continuation-in-part of application No. 16/161,960, filed on Oct. 16, 2018, now Pat. No. 10,644,235, and a continuation-in-part of application No. 16/274,998, filed on Feb. 13, 2019, and a continuation-in-part of application No. 16/276,094, filed on Feb. 14, 2019, and a continuation-in-part of application No. 16/543,466, filed on Aug. 16, 2019, and a continuation-in-part of application No. 16/544,724, filed on Aug. 19, 2019.

(51) Int. Cl.
   *G01R 31/28* (2006.01)
   *G01R 31/327* (2006.01)

(56) References Cited

U.S. PATENT DOCUMENTS

| | | | |
|---|---|---|---|
| 7,920,414 | B2 | 4/2011 | Lowrey |
| 8,314,983 | B2 | 11/2012 | Frank |
| 8,345,472 | B2 | 1/2013 | Lee |
| 9,257,647 | B2 | 2/2016 | Borodulin |
| 9,362,492 | B2 | 6/2016 | Goktepeti |
| 9,368,720 | B1 | 6/2016 | Moon |
| 9,444,430 | B1 | 9/2016 | Abdo |
| 9,601,545 | B1 | 3/2017 | Tu |
| 9,640,759 | B1 | 5/2017 | Curioni |
| 9,891,112 | B1 | 2/2018 | Abel |
| 9,917,104 | B1 | 3/2018 | Roizin |
| 10,128,243 | B2 | 11/2018 | Yoo |
| 10,164,608 | B2 | 12/2018 | Belot |
| 10,529,922 | B1 | 1/2020 | Howard |
| 2005/0127348 | A1 | 6/2005 | Horak |
| 2006/0246712 | A1 | 11/2006 | Kim |
| 2007/0075347 | A1 | 4/2007 | Lai |
| 2007/0247899 | A1 | 10/2007 | Gordon |
| 2008/0142775 | A1 | 6/2008 | Chen |
| 2009/0108247 | A1 | 4/2009 | Takaura |
| 2010/0008127 | A1 | 1/2010 | Muraoka |
| 2010/0084626 | A1 | 4/2010 | Delhougne |
| 2010/0237314 | A1 | 9/2010 | Tsukamoto |
| 2010/0238720 | A1 | 9/2010 | Tio Castro |
| 2011/0002158 | A1 | 1/2011 | Muraoka |
| 2011/0291784 | A1 | 12/2011 | Nakatsuji |
| 2013/0187120 | A1 | 7/2013 | Redaelli |
| 2013/0285000 | A1 | 10/2013 | Arai |
| 2014/0191181 | A1 | 7/2014 | Moon |
| 2014/0264230 | A1 | 9/2014 | Borodulin |
| 2014/0339610 | A1 | 11/2014 | Rashed |
| 2015/0048424 | A1 | 2/2015 | Tien |
| 2015/0090949 | A1 | 4/2015 | Chang |
| 2015/0249096 | A1 | 9/2015 | Lupino |
| 2015/0333131 | A1 | 11/2015 | Mojumder |
| 2016/0035973 | A1 | 2/2016 | Raieszadeh |
| 2016/0056373 | A1 | 2/2016 | Goktepeli |
| 2016/0308507 | A1 | 10/2016 | Engelen |
| 2017/0092694 | A1 | 3/2017 | BrightSky |
| 2017/0126205 | A1 | 5/2017 | Lin |
| 2017/0187347 | A1 | 6/2017 | Rinaldi |
| 2017/0243861 | A1 | 8/2017 | Wang |
| 2017/0365427 | A1 | 12/2017 | Borodulin |
| 2018/0005786 | A1 | 1/2018 | Navarro |
| 2018/0122825 | A1 | 5/2018 | Lupino |
| 2018/0138894 | A1 | 5/2018 | Belot |
| 2018/0194615 | A1 | 7/2018 | Nawaz |
| 2018/0266974 | A1* | 9/2018 | Khosravani .......... G01N 27/041 |
| 2018/0269393 | A1 | 9/2018 | Zhang |
| 2019/0064555 | A1 | 2/2019 | Hosseini |
| 2019/0067572 | A1 | 2/2019 | Tsai |
| 2019/0088721 | A1 | 3/2019 | Reig |
| 2019/0172657 | A1 | 6/2019 | Zhu |
| 2019/0267214 | A1 | 8/2019 | Liu |
| 2019/0296718 | A1 | 9/2019 | Birkbeck |

OTHER PUBLICATIONS

N. El-Hinnawy et al., "A 7.3 THz Cut-Off Frequency, Inline, Chalcogenide Phase-Change RF Switch Using an Independent Resistive Heater for Thermal Actuation," 2013 *IEEE Compound Semiconductor Integrated Circuit Symposium (CSICS)*, Monterey, CA, 2013, pp. 1-4.

G. Slovin, et al. "AlN Barriers for Capacitance Reduction in Phase-Change RF Switches," in *IEEE Electron Device Letters*, vol. 37, No. 5, pp. 568-571, May 2016.

* cited by examiner

READ OUT INTEGRATED CIRCUIT (ROIC) FOR RAPID TESTING AND CHARACTERIZATION OF RESISTIVITY CHANGE OF HEATING ELEMENT IN PHASE-CHANGE MATERIAL (PCM) RADIO FREQUENCY (RF) SWITCH

CLAIMS OF PRIORITY

The present application is a continuation-in-part of and claims the benefit of and priority to application Ser. No. 16/103,490 filed on Aug. 14, 2018, titled "Manufacturing RF Switch Based on Phase-Change Material,". The present application is also a continuation-in-part of and claims the benefit of and priority to application Ser. No. 16/103,587 filed on Aug. 14, 2018, titled "Design for High Reliability RF Switch Based on Phase-Change Material,". The present application is also a continuation-in-part of and claims the benefit of and priority to application Ser. No. 16/103,646 filed on Aug. 14, 2018, titled "PCM RF Switch Fabrication with Subtractively Formed Heater,". The present application is further a continuation-in-part of and claims the benefit of and priority to application Ser. No. 16/114,106 filed on Aug. 27, 2018, titled "Fabrication of Contacts in an RF Switch Having a Phase-Change Material (PCM) and a Heating Element,". The present application is also a continuation-in-part of and claims the benefit of and priority to application Ser. No. 16/161,960 filed on Oct. 16, 2018, titled "Phase-Change Material (PCM) Radio Frequency (RF) Switch with Reduced Parasitic Capacitance,". Furthermore, the present application is a continuation-in-part of and claims the benefit of and priority to application Ser. No. 16/274,998 filed on Feb. 13, 2019, titled "Semiconductor Devices Having Phase-Change Material (PCM) Radio Frequency (RF) Switches and Integrated Passive Devices,". In addition, the present application is a continuation-in-part of and claims the benefit of and priority to application Ser. No. 16/276,094 filed on Feb. 14, 2019, titled "Semiconductor Devices Having Phase-Change Material (PCM) Radio Frequency (RF) Switches and Integrated Active Devices,". Furthermore, the present application is a continuation-in-part of and claims the benefit of and priority to application Ser. No. 16/543,466 filed on Aug. 16, 2019, titled "Read Out Integrated Circuit (ROIC) for Rapid Testing of Functionality of Phase-Change Material (PCM) Radio Frequency (RF) Switches,". The present application is also a continuation-in-part of and claims the benefit of and priority to application Ser. No. 16/544,724 filed on Aug. 19, 2019, titled "Read Out Integrated Circuit (ROIC) for Rapid Testing and Characterization of Conductivity Skew of Phase-Change Material (PCM) in PCM Radio Frequency (RF) Switches.". The disclosures and contents of all of the above-identified applications are hereby incorporated fully by reference into the present application.

BACKGROUND

Phase-change materials (PCM) are capable of transforming between a crystalline phase to an amorphous phase and vice versa. These two solid phases exhibit differences in electrical properties, and semiconductor devices can advantageously exploit these differences. Given the ever-increasing reliance on radio frequency (RF) communication, there is particular need for RF switching devices to exploit phase-change materials. However, the capability of phase-change materials for phase transformation depends heavily on how they are exposed to thermal energy and how they are allowed to release thermal energy. For example, in order to transform into an amorphous state, phase-change materials may need to achieve temperatures of approximately seven hundred degrees Celsius (700° C.) or more, and may need to cool down within hundreds of nanoseconds.

A heating element repeatedly generating such high temperatures can experience a detrimental change in its resistivity over time. Undesirable change in the resistance of the heating element due to repeated OFF/ON cycling can cause a PCM RF switch to consume more power when switching between OFF and ON states. Resistivity change of the heating element can also result in the PCM RF switch taking longer when switching between OFF and ON states. Thus, resistivity change of the heating element is a figure of merit that can determine the marketability of the PCM RF switch and its suitability for a given application.

Accurately quantifying resistivity change of a heating element in a PCM RF switch can be problematic. Computer simulations cannot accurately predict the resistivity of the heating element over an entire lifetime. It might be necessary to perform more than one million OFF/ON cycles before the heating element exhibits any detectable resistivity change. Further, it might be necessary to detect resistivity change of the heating element in thousands of PCM RF switches in order to achieve statistically significant results regarding the degree of resistivity change for a given PCM RF switch design. Moreover, resistivity change due to repeated OFF/ON cycling is not easily distinguished from other changes due to the temperature coefficient of resistance (TCR) of the heating element.

Conventional techniques of testing RF switches, for example, by connecting external probes of an automated test equipment (ATE) to one RF switch at a time, have significant time delays that render generating large sets of test data impractical. When resorting to conventional testing in the context of PCM RF switches, time delays associated with generating the required temperatures to crystallize and amorphize the PCM in each individual RF switch additionally impede generating large sets of test data. Conventional means of testing can also introduce problems associated with the impedance of cables or wirebonds, and reduce the accuracy of test data.

Thus, there is need in the art to generate large sets of data for determining and characterizing resistivity change of heating elements in PCM RF switches accurately and rapidly.

SUMMARY

The present disclosure is directed to a read out integrated circuit (ROIC) for rapid testing and characterization of resistivity change of heating element in phase-change material (PCM) radio frequency (RF) switch, substantially as shown in and/or described in connection with at least one of the figures, and as set forth in the claims.

DETAILED DESCRIPTION

Figure 1:
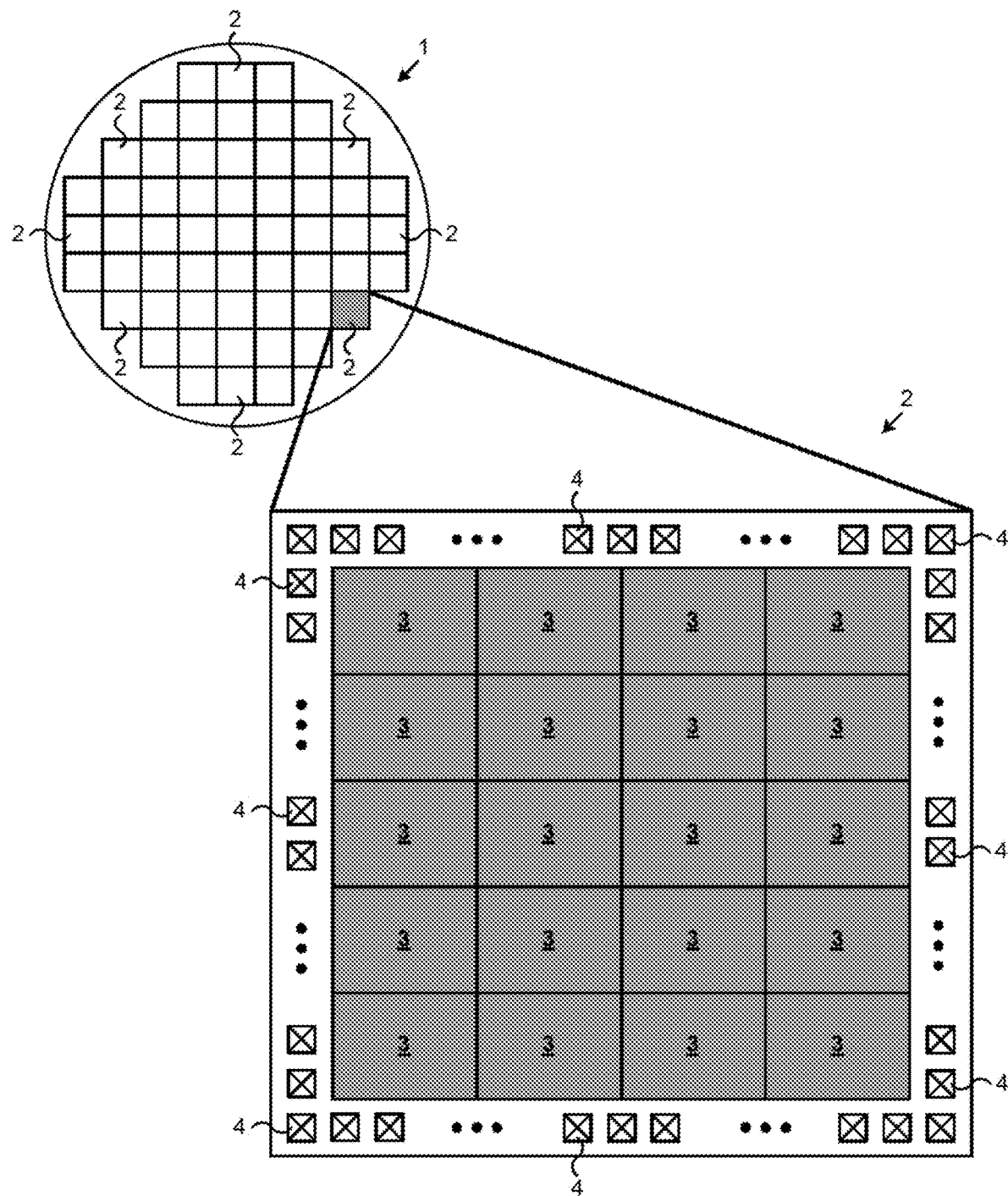
FIG. 1 illustrates a layout of a wafer and an expanded layout of a rapid testing read out integrated circuit (ROIC) according to one implementation of the present application.

The following description contains specific information pertaining to implementations in the present disclosure. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

FIG. 1 illustrates a layout of a wafer and an expanded layout of a rapid testing read out integrated circuit (ROIC) according to one implementation of the present application. As shown in FIG. 1, wafer 1 includes multiple ROICs 2. Each of the ROICs 2 has a corresponding die on wafer 1. In one implementation, wafer 1 is a silicon wafer having a diameter of approximately two hundred millimeters (200 mm). In the present implementation, fifty seven (57) ROICs 2 are situated on wafer 1. In various implementations, wafer 1 can include greater or fewer ROICs 2. In one implementation, each of ROICs 2 has dimensions of approximately twenty millimeters by approximately twenty millimeters (20 mm×20 mm).

As shown in the expanded layout in FIG. 1, each of ROICs 2 includes designs 3 and contact pads 4. As described below, each of designs 3 includes an array of phase-change material (PCM) radio frequency (RF) switches (not shown in FIG. 1) to be tested. In the present implementation, each of ROICs 2 contains twenty designs 3. In various implementations, each of ROICs 2 can include greater or fewer designs 3. Different designs 3 can include different PCM RF switches. However, in one implementation, all designs 3 contain identical PCM RF switches. In one implementation, each of designs 3 has dimensions of approximately four millimeters by approximately five millimeters (4 mm×5 mm).

Contact pads 4 provide contact points for external probes (not shown in FIG. 1). As described below, programming signals and test signals for testing PCM RF switches in designs 3 are generated in ROICs 2. Thus, contact pads 4 are generally not used for receiving programming signals and test signals from external probes. Rather, contact pads 4 are generally used to read out test data generated by ROICs 2. External probes can be coupled to an automatic test equipment (ATE; not shown in FIG. 1) for receiving and analyzing test data generated by ROICs 2. Contact pads 4 can also be used for other functions, such as providing power and/or ground to ROICs 2, and providing bi-directional communications between ROICs 2 and the ATE. In the present implementation, contact pads 4 have an approximately square shape, line the edges of each of ROICs 2, and surround designs 3. In one implementation, each of contact pads 4 has dimensions of approximately one hundred fifty microns by approximately one hundred fifty microns (150 μm×150 μm). In various implementations, contact pads 4 can have any other shapes and/or arrangements in ROICs 2.

Figure 2:
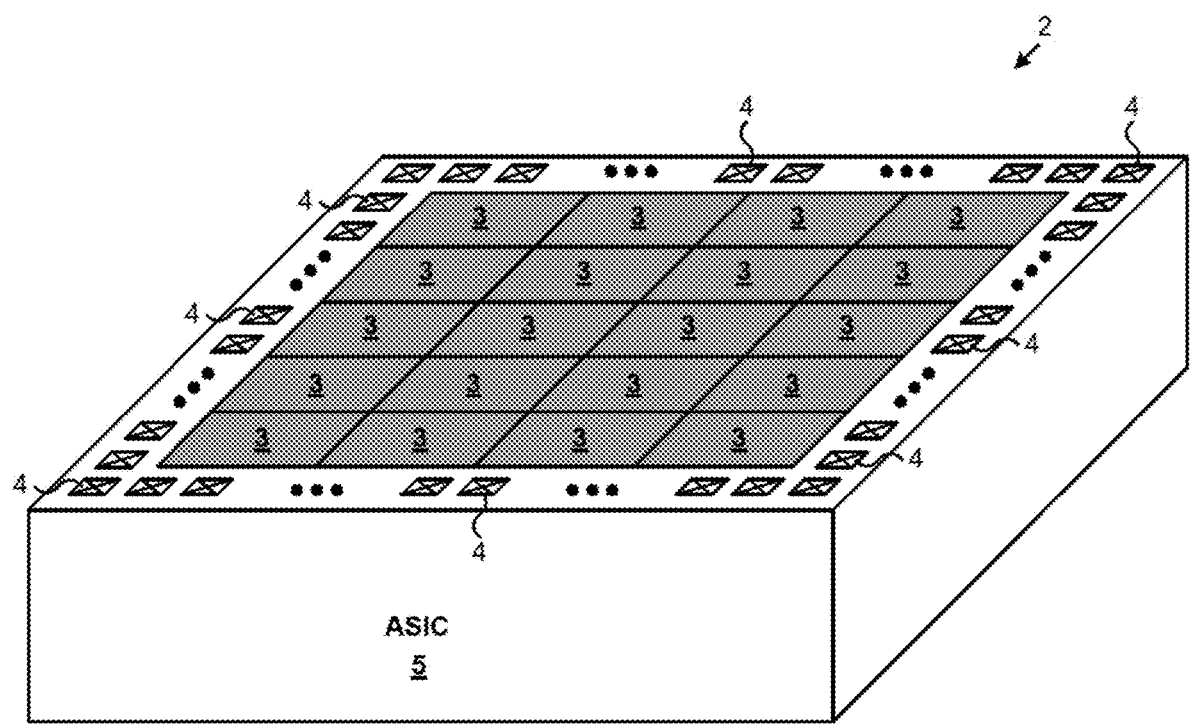
FIG. 2 illustrates a perspective view of a portion of a rapid testing ROIC according to one implementation of the present application.

FIG. 2 illustrates a perspective view of a portion of a rapid testing ROIC according to one implementation of the present application. ROIC 2 in FIG. 2 generally corresponds to any of ROICs 2 in FIG. 1. As shown in FIG. 2, ROIC 2 includes designs 3, contact pads 4, and application specific integrated circuit (ASIC) 5. Contact pads 4 and PCM RF switches in designs 3 reside on ASIC 5. As described below, circuitry for testing the PCM RF switches resides within ASIC 5. In particular, ASIC 5 includes circuitry for providing programming signals and test signals for testing PCM RF switches in designs 3. ASIC 5 also generates test data which can be read out through contact pads 4.

Figure 3:
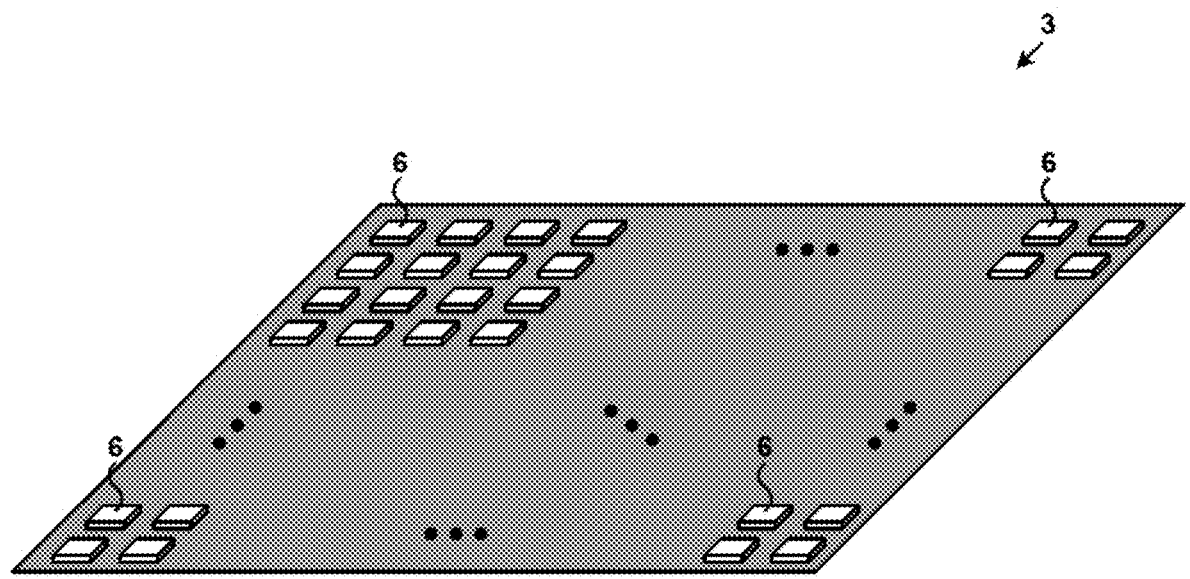
FIG. 3 illustrates a perspective view of a portion of an array of phase-change material (PCM) radio frequency (RF) switches according to one implementation of the present application.

FIG. 3 illustrates a perspective view of a portion of an array of phase-change material (PCM) radio frequency (RF) switches according to one implementation of the present application. Design 3 includes the array of PCM RF switches 6. Additional details regarding PCM RF switches 6 are described below. Design 3 in FIG. 3 generally corresponds to any of designs 3 in FIG. 2. Although design 3 is connected to test circuitry within an ASIC, such as ASIC 5 in FIG. 2, the connectors, test circuitry, and ASIC are not shown in FIG. 3.

In one implementation, design 3 includes one thousand (1,000) PCM RF switches 6. In this implementation, each of the twenty designs 3 in FIG. 2 can include one thousand PCM RF switches 6, and ROIC 2 in FIG. 2 can have a total of twenty thousand (20,000) PCM RF switches 6. Different designs 3 can include different PCM RF switches. However, in one implementation, all designs 3 contain identical PCM RF switches. Each of the fifty seven (57) ROICs 2 in wafer 1 in FIG. 1 can include twenty thousand (20,000) PCM RF switches 6, and wafer 1 in FIG. 1 can have a total of one million one hundred forty thousand (1,140,000) PCM RF switches 6. In various implementations, design 3 can include more of fewer PCM RF switches 6. In various implementations, PCM RF switches 6 can be arranged in manners other than an array.

Testing large numbers of PCM RF switches 6 using conventional means, for example, by connecting external probes of an ATE to one individual PCM RF switch at a time, would be impractical. In order to achieve statistically significant results regarding the reliability of a PCM RF switch, it might be necessary to test the PCM RF switch for more than one million OFF/ON cycles. Due to time delays associated with switching between OFF/ON states and time delays associated with generating test data, it could take a day or longer to complete more than one million OFF/ON cycles for a single PCM RF switch. Thus, testing all twenty thousand (20,000) PCM RF switches 6 on a single ROIC 2 would take an impractically long time. Also, as described below, PCM RF switches 6 can have four terminals. External probes and corresponding contact pads are generally significantly larger than PCM RF switches 6. As such, providing contact pads for each terminal of the twenty thousand (20,000) PCM RF switches 6 on ROIC 2 would also be impractical.

Figure 4:
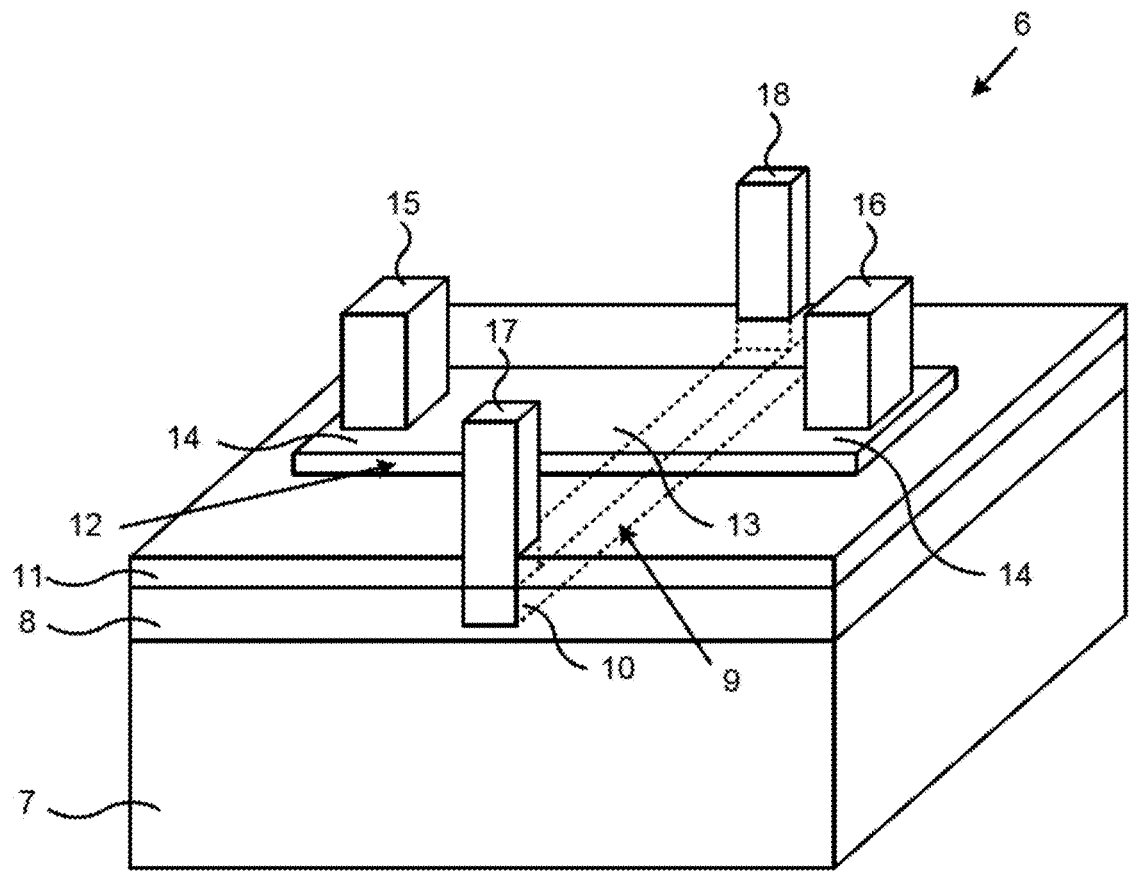
FIG. 4 illustrates a perspective view of a portion of PCM RF switch according to one implementation of the present application.

FIG. 4 illustrates a perspective view of a portion of PCM RF switch according to one implementation of the present application. PCM RF switch 6 in FIG. 4 generally corresponds to any of PCM RF switches 6 in FIG. 3. As shown in FIG. 4, PCM RF switch 6 includes substrate 7, lower dielectric 8, heating element 9 having terminal segments 10, thermally conductive and electrically insulating material 11, PCM 12 having active segment 13 and passive segments 14, PCM contacts 15 and 16, and heater contacts 17 and 18. For purposes of illustration, the perspective view in FIG. 4 shows selected structures of PCM RF switch 6. PCM RF switch 6 may include other structures not shown in FIG. 4.

Substrate 7 is situated under lower dielectric 8. In one implementation, substrate 7 is an insulator, such as silicon oxide ($SiO_2$). In various implementations, substrate 7 is a silicon (Si), silicon-on-insulator (SOI), sapphire, complementary metal-oxide-semiconductor (CMOS), bipolar CMOS (BiCMOS), or group III-V substrate. In various implementations, substrate 7 includes a heat spreader or substrate 7 itself performs as a heat spreader. Substrate 7 can have additional layers (not shown in FIG. 4). In one implementation, substrate 7 can comprise a plurality of interconnect metal levels and interlayer dielectric layers. Substrate 7 can also comprise a plurality of devices, such as integrated passive devices (not shown in FIG. 4).

Lower dielectric 8 in PCM RF switch 6 is situated above substrate 7 and below thermally conductive and electrically insulating material 11. As shown in FIG. 4, lower dielectric 8 is also adjacent to sides of heating element 9. Lower dielectric 8 extends along the width of PCM RF switch 6, and is also coplanar with the top of heating element 9. Because PCM RF switch 6 includes lower dielectric 8 on the sides of heating element 9, less heat transfers horizontally (i.e., from the sides) and more heat dissipates vertically, from heating element 9 toward active segment 13 of PCM 12. In various implementations, lower dielectric 8 can have a relative width and/or a relative thickness greater or less than shown in FIG. 4. Lower dielectric 8 can comprise any material with thermal conductivity less than that of thermally conductive and electrically insulating material 11.

Heating element 9 in PCM RF switch 6 is situated in lower dielectric 8. Heating element 9 also approximately defines active segment 13 of PCM 12. Heating element 9 generates a crystallizing heat pulse or an amorphizing heat pulse for transforming active segment 13 of PCM 12. Heating element 9 can comprise any material capable of Joule heating. Heating element 9 can be connected to electrodes of a pulser (not shown in FIG. 4) that generates voltage or current pulses. Preferably, heating element 9 comprises a material that exhibits minimal or substantially no electromigration, thermal stress migration, and/or agglomeration. In various implementations, heating element 9 can comprise tungsten (W), molybdenm (Mo), titanium (Ti), titanium tungsten (TiW), titanium nitride (TiN), tantalumn (Ta), tantalum nitride (TaN), nickel chromium (NiCr), or nickel chromium silicon (NiCrSi). For example, in one implementation, heating element 9 comprises tungsten lined with titanium and titanium nitride.

Thermally conductive and electrically insulating material 11 in PCM RF switch 6 is situated on top of heating element 9 and lower dielectric layer 8, and under PCM 12 and, in particular, under active segment 13 of PCM 12. Thermally conductive and electrically insulating material 11 ensures efficient heat transfer from heating element 9 toward active segment 13 of PCM 12, while electrically insulating heating element 9 from PCM contacts 15 and 16. PCM 12, and other neighboring structures.

Thermally conductive and electrically insulating material 11 can comprise any material with high thermal conductivity and high electrical resistivity. In various implementations, thermally conductive and electrically insulating material 11 can comprise silicon carbide ($Si_XC_Y$), aluminum nitride ($Al_XN_Y$), aluminum oxide ($Al_XO_Y$), beryllium oxide ($Be_XO_Y$), diamond, or diamond-like carbon. In one implementation, thermally conductive and electrically insulating material 11 can be a nugget that does not extend along the width of PCM RF switch 6. For example, thermally conductive and electrically insulating material 11 can be a nugget approximately aligned with heating element 9.

PCM 12 in PCM RF switch 6 is situated on top of thermally conductive and electrically insulating material 11. PCM RF switch 6 utilizes PCM 12 to transfer input RF signals in an ON state and to block input RF signals in an OFF state. PCM 12 includes active segment 13 and passive segments 14. Active segment 13 of PCM 12 is approximately defined by heating element 9. Passive segments 14 of PCM 12 extend outward and are transverse to heating element 9, and are situated approximately under PCM contacts 15 and 16. As used herein. "active segment" refers to a segment of PCM that transforms between crystalline and amorphous phases, for example, in response to a crystallizing or an amorphizing heat pulse generated by heating element 9, whereas "passive segment" refers to a segment of PCM that does not make such transformation and maintains a crystalline phase (i.e., maintains a conductive state).

With proper heat pulses and heat dissipation, active segment 13 of PCM 12 can transform between amorphous and crystalline phases, allowing PCM RF switch 6 to switch between OFF and ON states respectively. Active segment 13 of PCM 12 must be heated and rapidly quenched in order for PCM RF switch 6 to switch states. If active segment 13 of PCM 12 does not quench rapidly enough, it will not transform, and PCM RF switch 6 will fail to switch states. How rapidly active segment 13 of PCM 12 must be quenched depends on the material, volume, and temperature of PCM 12. In one implementation, the quench time window can be approximately one hundred nanoseconds (100 ns) or greater or less.

PCM 12 can comprise germanium telluride ($Ge_XTe_Y$), germanium antimony telluride ($Ge_XSb_YTe_Z$), germanium selenide ($Ge_XSe_Y$), or any other chalcogenide. In various implementations, PCM 12 can be germanium telluride having from forty percent to sixty percent germanium by composition (i.e., $Ge_XTe_Y$, where $0.4 \leq X \leq 0.6$ and $Y=1-X$). The material for PCM 12 can be chosen based upon ON state resistivity, OFF state electric field breakdown voltage, crystallization temperature, melting temperature, or other considerations. It is noted that in FIG. 4, heating element 9 is transverse to PCM 12. Heating element 9 is illustrated with dashed lines as seen through various structures of PCM RF switch 6. Current flowing in heating element 9 flows approximately under active segment 13 of PCM 12.

PCM contacts 15 and 16 in PCM RF switch 6 are connected to passive segments 14 of PCM 12. Similarly, heater contacts 17 and 18 are connected to terminal segments 10 of heating element 9. PCM contacts 15 and 16 provide RF signals to and from PCM 12. Heater contacts 17 and 18 provide power to heating element 9 for generating a crystallizing heat pulse or an amorphizing heat pulse. In various implementations, PCM contacts 15 and 16 and heater contacts 17 and 18 can comprise tungsten (W), copper (Cu), or aluminum (Al). PCM contacts 15 and 16 and heater contacts 17 and 18 can extend through various dielectric layers (not shown in FIG. 4). In one implementation, in order to ensure uniform contact between PCM 12 and PCM contacts 15 and 16, PCM contacts 15 and 16 can extend through a contact uniformity support layer (not shown in FIG. 4) situated on top of PCM 12, as disclosed in U.S. patent application Ser. No. 16/103,490 filed on Aug. 14, 2018, titled "Manufacturing RF Switch Based on Phase-Change Material." The disclosure and content of the above-identified application are incorporated fully by reference into the present application.

Figure 5A:
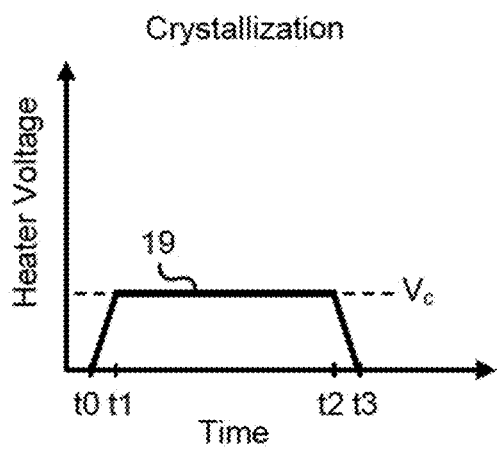
FIG. 5A illustrates an exemplary graph of heater voltage versus time according to one implementation of the present application.

FIG. 5A illustrates an exemplary graph of heater voltage versus time according to one implementation of the present application. The heater voltage-time graph in FIG. 5A represents the voltage at a heater contact of a heating element, such as heater contact 18 of heating element 9 in FIG. 4, plotted over time when crystallizing electrical pulse 19 is applied to the heating element. As shown in FIG. 5A, from time t0 to time t1, crystallizing electrical pulse 19 rises from zero voltage to approximately crystallization voltage $V_C$. From time t1 to time t2, crystallizing electrical pulse 19 remains approximately at crystallization voltage $V_C$. From time t2 to time t3, crystallizing electrical pulse 19 falls from approximately crystallization voltage $V_C$ to zero voltage.

An electrical pulse that holds the heating element at or above crystallization voltage $V_C$ for a sufficient amount of time will cause the heating element to generate a crystallizing heat pulse that will transform a PCM into a crystalline phase. Accordingly, such an electrical pulse is referred to as a "crystallizing electrical pulse" in the present application. Crystallization voltage $V_C$ and the amount of time needed to transform the PCM into a crystalline phase depends on various factors, such the material, dimensions, temperature, and thermal conductivity of the heating element, the PCM, and their neighboring structures. In one implementation, crystallization voltage $V_C$ can be approximately six volts (6 V). In one implementation, the time required can range from approximately one hundred nanoseconds to two thousand nanoseconds (100 ns-2,000 ns) or greater or less. In the present exemplary implementation, the duration from time t1 to time t2 in FIG. 5A can be approximately one thousand nanoseconds (1.000 ns). The duration from time t0 to time t1 and the duration from time t2 to time t3 in FIG. 5A represent rise and fall times of a pulser, and can each be approximately ten nanoseconds (10 ns) or less.

Figure 5B:
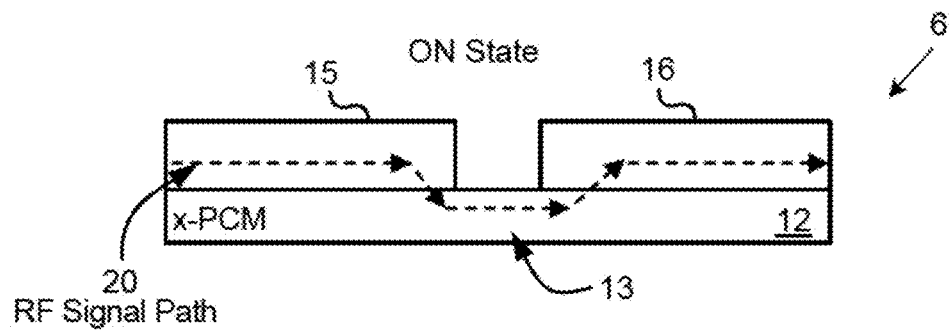
FIG. 5B illustrates a portion of an exemplary PCM RF switch in an ON state according to one implementation of the present application.

FIG. 5B illustrates a portion of an exemplary PCM RF switch in an ON state according to one implementation of the present application. PCM RF switch 6 in FIG. 5B generally corresponds to PCM RF switch 6 in FIG. 4, and may have any implementations or advantages described above. As illustrated in Figure 5B, PCM RF switch 6 includes PCM 12 having active segment 13, PCM contacts 15 and 16, and RF signal path (or simply referred to as "RF signal") 20.

FIG. 5B illustrates PCM RF switch 6 after a crystallizing electrical pulse, such as crystallizing electrical pulse 19 in FIG. 5A, is applied to a heating element. As shown in FIG. 5B, PCM 12 is uniform and is denoted with the label "x-PCM." to indicate that PCM 12, including active segment 13 of PCM 12, is in the crystalline phase. PCM 12 in the crystalline phase has low resistivity and is able to easily conduct electrical current. Accordingly, RF signal 20 propagates along a path from PCM contact 15, through PCM 12, to PCM contact 16. It is noted that PCM contacts 15 and 16 can be substantially symmetrical and that their roles in PCM RF switch 6 can be reversed. PCM RF switch 6 in FIG. 5B is in an ON state.

Figure 6A:
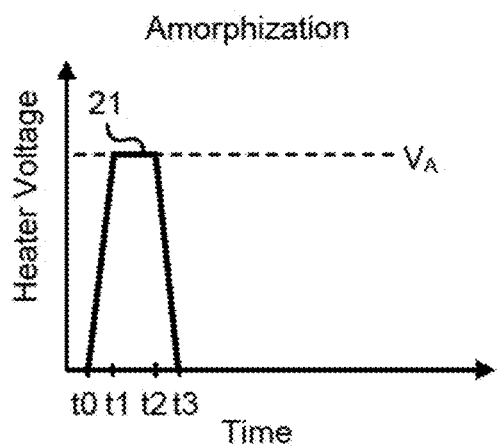
FIG. 6A illustrates an exemplary graph of heater voltage versus time according to one implementation of the present application.

FIG. 6A illustrates an exemplary graph of heater voltage versus time according to one implementation of the present application. The heater voltage-time graph in FIG. 6A represents the voltage at a heater contact of a heating element, such as heater contact 18 of heating element 9 in FIG. 4, plotted over time when amorphizing electrical pulse 21 is applied to the heating element. As shown in FIG. 6A, from time t0 to time t1, amorphizing electrical pulse 21 rises from zero voltage to approximately amorphization voltage $V_A$. From time t1 to time t2, amorphizing electrical pulse 21 remains approximately at amorphization voltage $V_A$. From time t2 to time t3, amorphizing electrical pulse 21 falls from approximately amorphization voltage $V_A$ to zero voltage.

An electrical pulse that holds the heating element at or above amorphization voltage $V_A$ for a brief amount of time will cause the heating element to generate an amorphizing heat pulse that will transform a PCM into an amorphous phase. Accordingly, such an electrical pulse is referred to as an "amorphizing electrical pulse" in the present application. Amorphization voltage $V_A$ and how briefly that voltage can be held to transform the PCM into an amorphous phase depends on various factors, such as the material, dimensions, temperature, and thermal conductivity of the heating element, the PCM, and their neighboring structures. In one implementation, amorphization voltage $V_A$ can be approximately fifteen volts (15 V). In one implementation, the time required can range from approximately fifty nanoseconds or less to approximately five hundred nanoseconds or less (50 ns-500 ns). In the present exemplary implementation, the duration from time t1 to time t2 in FIG. 6A can be approximately one hundred nanoseconds (100 ns). The duration from time t0 to time t1 and the duration from time t2 to time t3 in FIG. 6A represent rise and fall times of a pulser, and can each be approximately ten nanoseconds (10 ns) or less.

Figure 6B:
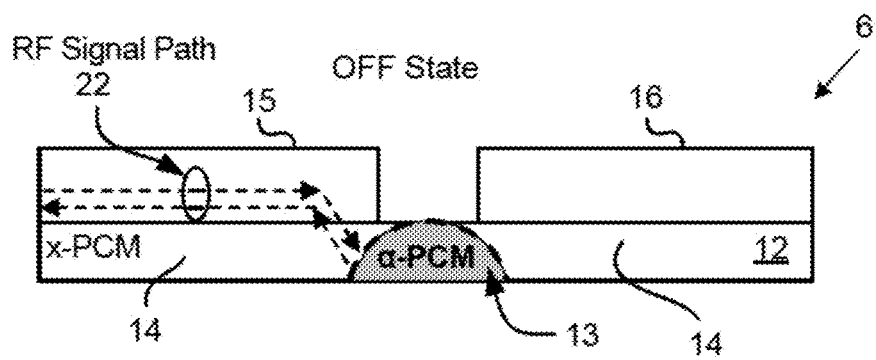
FIG. 6B illustrates a portion of an exemplary PCM RF switch in an OFF state according to one implementation of the present application.

FIG. 6B illustrates a portion of an exemplary PCM RF switch in an OFF state according to one implementation of the present application. PCM RF switch 6 in FIG. 6B generally corresponds to PCM RF switch 6 in FIG. 4, and may have any implementations or advantages described above. As illustrated in FIG. 6B, PCM RF switch 6 includes PCM 12 having active segment 13 and passive segments 14, PCM contacts 15 and 16, and RF signal path (or simply referred to as "RF signal") 22.

FIG. 6B illustrates PCM RF switch 6 after an amorphizing electrical pulse, such as amorphizing electrical pulse 21 in FIG. 6A, is applied to a heating element. As shown in FIG. 6B, PCM 12 is not uniform. Active segment 13 is denoted with the label "α-PCM," to indicate that active segment 13 is in the amorphous phase. Passive segments 14 are denoted with the label "x-PCM," to indicate that passive segments 14 are in the crystalline phase. As described above, "active segment" refers to a segment of PCM that transforms between crystalline and amorphous phases, whereas "passive segment" refers to a segment of PCM that does not make such transformation and maintains a crystalline phase (i.e., maintains a conductive state). Active segment 13 of PCM 12 in the amorphous phase has high resistivity and is not able to conduct electrical current well. Accordingly, RF signal 22 does not propagate along a path from PCM contact 15, through PCM 12, to PCM contact 16. It is noted that PCM contacts 15 and 16 can be substantially symmetrical and that their roles in PCM RF switch 6 can be reversed. PCM RF switch 6 in FIG. 6B is in an OFF state.

Referring back to FIG. 4, as PCM RF switch 6 is cycled OFF and ON numerous times during its operation, heating element 9 repeatedly generates heat pulses that transform active segment 13 of PCM 12 between amorphous and crystalline phases in response to amorphizing electrical pulses and crystallizing electrical pulses, such as amorphizing electrical pulse 21 in FIG. 6A and crystallizing electrical pulse 19 in FIG. 5A. When generating these heat pulses, particularly when generating amorphizing heat pulses, heating element 9 can achieve temperatures in excess of one thousand degrees Celsius (1,000° C.). Repetition of such high temperatures can cause annealing and other thermophysical hysteresis effects which detrimentally change the resistivity of heating element 9 over time. Resistivity change (i.e., undesirable change in resistance) of heating element 9 can cause PCM RF switch 6 to consume more power and take more time when switching between OFF and ON states.

The degree of resistivity change is difficult to predict using conventional means. Resistivity change can be infrequent and random in nature. Computer simulations cannot accurately predict the resistivity of heating element 9 over an entire lifetime. It might be necessary to perform more than one million OFF/ON cycles before heating element 9 exhibits any detectable resistivity change. Further, it might be necessary to detect resistivity change in thousands of PCM RF switches 6 in order to achieve statistically significant results regarding the degree of resistivity change for a given PCM RF switch design. For example, twenty thousand PCM RF switches 6 may each have to be tested through one million OFF/ON cycles to confidently determine the average resistivity change and the variance in resistivity change for a given PCM RF switch design. As described above, it could take a day or longer to complete more than one million OFF/ON cycles for a single PCM RF switch 6. Testing all twenty thousand PCM RF switches 6 on a single ROIC 2 (shown in FIG. 2) would take an impractically long time.

Moreover, the resistance of heating element 9 changes with temperature. In particular, when heating element 9 is actively generating amorphizing or crystallizing heat pulses in response to amorphizing or crystallizing electrical pulses, its resistance will be higher. The thermal coefficient of resistance (TCR) characterizes the change in resistance of a material with temperature. In one implementation, the TCR of heating element 9 can range from approximately $0.0024\Omega/°$ C. to $0.0044\Omega/°$ C., and the change in temperature of heating element 9 in response to an amorphizing electrical pulse can be approximately one thousand degrees Celsius (1,000° C.). Thus, the change in resistance of heating element 9 while an amorphizing electrical pulse is actively being applied can range from approximately $2.4\Omega$ higher to approximately $4.4\Omega$ higher compared to when heating element 9 is at room temperature. In various implementations, the resistance of heating element 9 at room temperature can range from approximately $10\Omega$ to approximately $40\Omega$. Thus, the increase in resistance of heating element 9 can range from approximately 6% higher to approximately 44% higher due to TCR. This increased resistance due to TCR may be significantly higher than any change in resistance due to resistivity change. Accordingly, resistivity change of heating element 9 cannot be accurately determined while heating element 9 is actively generating heat pulses.

Figure 7:
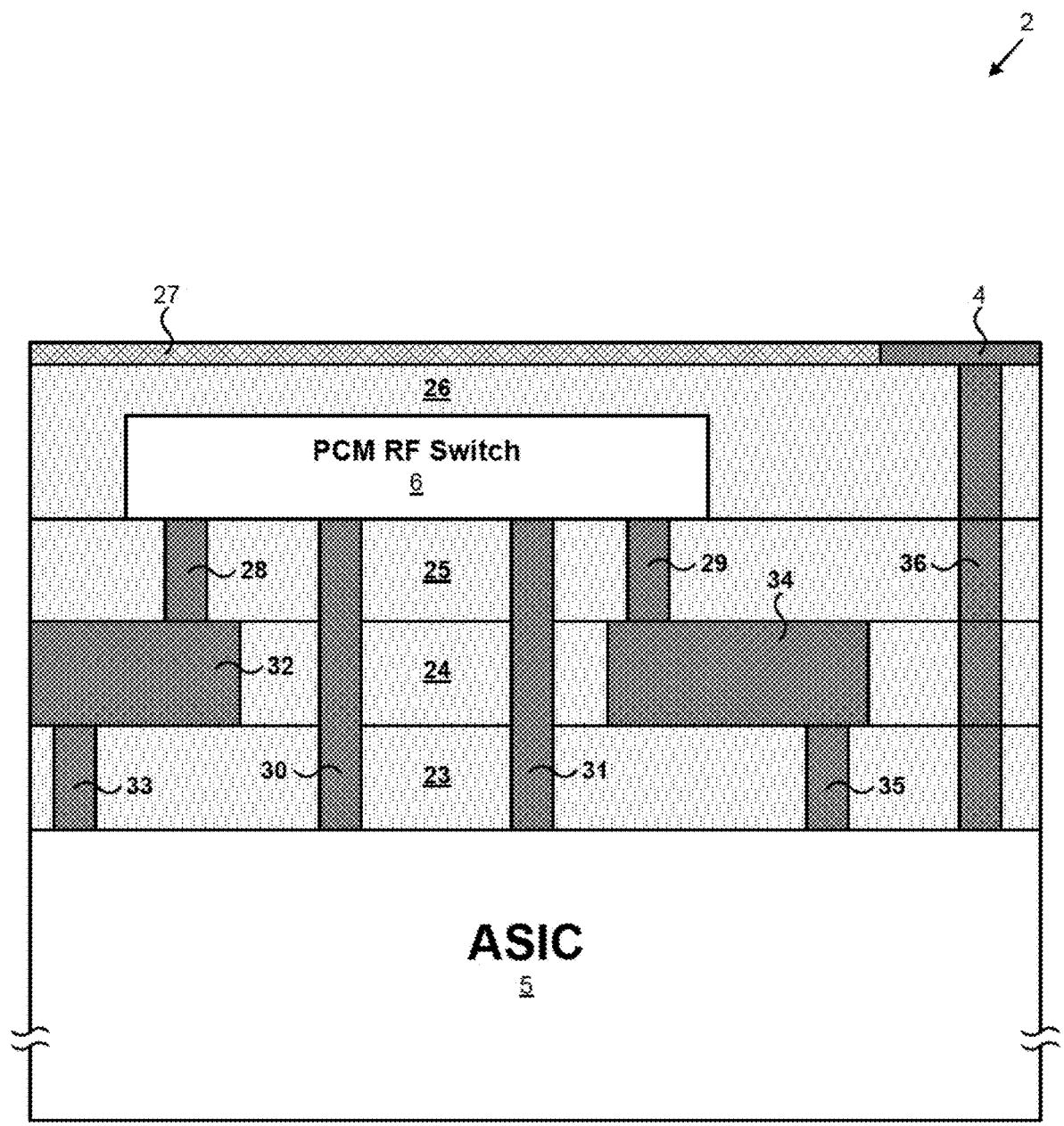
FIG. 7 illustrates a cross-sectional view of a portion of a rapid testing ROIC according to one implementation of the present application.

FIG. 7 illustrates a cross-sectional view of a portion of a rapid testing ROIC according to one implementation of the present application. ROIC 2 includes ASIC 5, PCM RF switch 6, pre-metal dielectric 23, first metallization level 24, first interlayer dielectric 25, second metallization level 26, passivation 27, vias 28, 29, 30, 31, 33, 35, and 36, interconnect metals 32 and 34, and contact pad 4. It is noted that in the present application, multiple vias, metal segments, and contacts connected as a unit may be referred to as a "via" for ease of reference. For example, in FIG. 7, via 36 includes a contact in pre-metal dielectric 23, a first metal segment in first metallization level 24, a first via in first interlayer dielectric 25, and a second metal segment in second metallization level 26. Metal segments are typically wider than vias and contacts and include overplots; however, for ease of illustration and for focus on the present inventive concepts, the metal segments and vias and contacts are shown as one continuous "via" 36 in ROIC 2.

PCM RF switch 6 in FIG. 7 generally corresponds to PCM RF switch 6 in FIG. 4, and may have any implementations and advantages described above. However, PCM RF switch 6 is shown with less detail in FIG. 7 to preserve conciseness. Pre-metal dielectric 23 is situated over ASIC 5. First metallization level 24, first interlayer dielectric 25, second metallization level 26, and passivation 27 are sequentially situated over pre-metal dielectric 23. In various implementations, pre-metal dielectric 23 can comprise borophosphosilicate glass (BPSG), tetra-ethyl ortho-silicate (TEOS), silicon onynitride ($Si_xO_YN_Z$), silicon oxide ($Si_xO_Y$), silicon nitride ($Si_xN_Y$), or another dielectric. In various implementations, first interlayer dielectric 25 and passivation 27 can comprise $Si_xO_Y$, $Si_xN_Y$, or another dielectric. For example, in one implementation, first interlayer dielectric 25 comprises chemical vapor deposition (CVD) $Si_xO_Y$, and passivation 27 comprises high density plasma CVD (HDP-CVD) $Si_xN_Y$. Moreover, first metallization level 24 and second metallization level 26 can comprise $Si_xO_Y$, $Si_xN_Y$, or another dielectric between metal segments in each metallization level. For example, in one implementation, first metallization level 24 and second metallization level 26 can include HDP-CVD $Si_xO_Y$ between metal segments in each metallization level. In various implementations, ROIC 2 can include more metallization levels and/or more interlayer dielectrics than those shown in FIG. 7.

PCM RF switch 6 is situated in second metallization level 26. Vias 28, 29, 30, and 31 are situated below PCM RF switch 6. Vias 28 and 29 electrically connect to PCM contacts 15 and 16 respectively (shown in FIG. 4) of PCM RF switch 6. Vias 30 and 31 electrically connect to heater contacts 17 and 18 respectively (shown in FIG. 4) of PCM RF switch 6. Via 33 is situated in pre-metal dielectric 23 between ASIC 5 and interconnect metal 32. Interconnect metal 32 is situated in first metallization level 24. Via 28 extends through first interlayer dielectric 25 between interconnect metal 32 and PCM RF switch 6. Via 28, interconnect metal 32, and via 33 electrically connect ASIC 5 to PCM contact 15 (shown in FIG. 4) of PCM RF switch 6. Via 35 is situated in pre-metal dielectric 23 between ASIC 5 and interconnect metal 34. Interconnect metal 34 is situated in first metallization level 24. Via 29 extends through first interlayer dielectric 25 between interconnect metal 34 and PCM RF switch 6. Via 29, interconnect metal 34, and via 35 electrically connect ASIC 5 to PCM contact 16 (shown in FIG. 4) of PCM RF switch 6. Vias 30 and 31 electrically connect heater contacts 17 and 18 respectively (shown in FIG. 4) of PCM RF switch 6 to ASIC 5. Contact pad 4 is situated at the top of ROIC 2 and in a window in passivation 27. Via 36 electrically connects ASIC 5 to contact pad 4.

In various implementations, ROIC 2 can include more or fewer vias and/or interconnect metals than those shown in FIG. 7. Vias and interconnect metals can also electrically connect to other structures (not shown in FIG. 7), such as passive devices built in various metallization levels. Also, it is noted that the actual relative position of vias 28, 29, 30, and 31 may be different from the exemplary cross-sectional view shown in FIG. 7. For example, via 30 in FIG. 7 (connected to heater contact 17 in FIG. 4) may be situated on a different plane relative to vias 28 and 29 (connected to PCM contacts 15 and 16 in FIG. 4 respectively), and via 31 in FIG. 7 (connected to heater contact 18 in FIG. 4) may be situated on yet a different plane relative to vias 28 and 29. In other words, vias 28 and 29 may be situated in different planes and crosswise to vias 30 and 31.

As described below, ASIC 5 includes circuitry for testing PCM RF switch 6, such as circuitry for generating crystallizing and amorphizing electrical pulses and circuitry for generating test signals. Vias 28, 29, 30, 31, 33, 35, and 36 and interconnect metals 32 and 34 provide connections between this test circuitry and PCM RF switch 6. ASIC 5 is also electrically connected to contact pad 4. Contact pad 4 in FIG. 7 generally corresponds to any of contact pads 4 in FIG. 2. As described above, contact pad 4 provides a contact point for external probes (not shown in FIG. 7) used for reading out test data generated by ROIC 2 and for other functions, such as providing power and/or ground to ROIC 2, and providing bi-directional communications between ROIC 2 and an ATE.

Figure 8A:
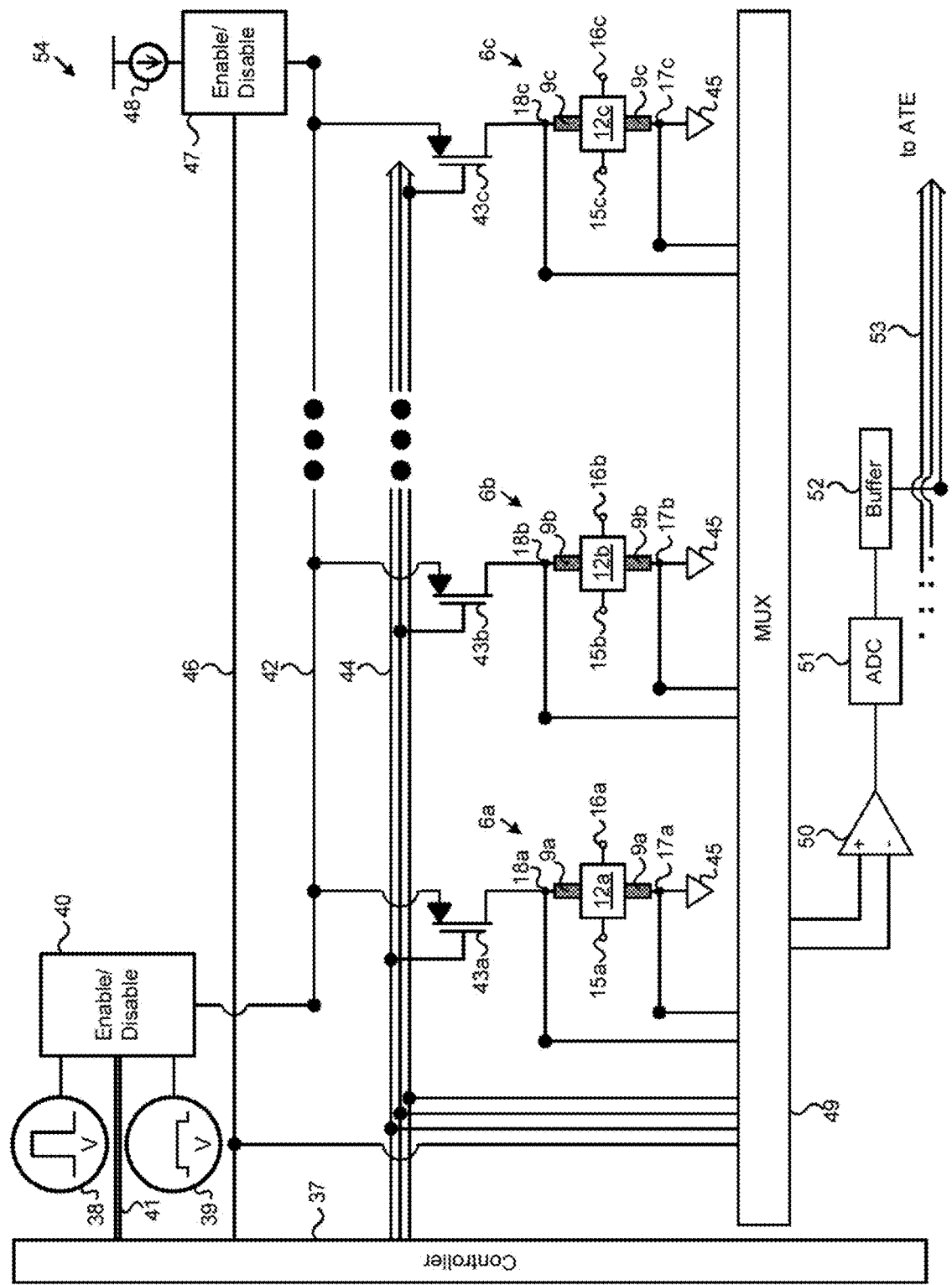
FIG. 8A illustrates a circuit in a portion of a rapid testing ROIC according to one implementation of the present application.

FIG. 8A illustrates a circuit in a portion of a rapid testing ROIC according to one implementation of the present application. As shown in FIG. 8A, circuit 54 includes PCM RF switches 6a, 6b, and 6c, controller 37, pulsers 38 and 39, enable/disable block 40, pulser control bus 41, pulser line 42, enable transistors 43a. 43b, and 43c, enable control bus 44, ground 45, test current control line 46, enable/disable block 47, current source 48, multiplexer (MUX) 49, differential amplifier 50, analog-to-digital converter (ADC) 51, buffer 52, and read out bus 53. Circuit 54 in FIG. 8A generally illustrates test circuitry that supports any one of designs 3 in FIG. 2. Components other than PCM RF switches 6a, 6b, and 6c and connections thereto are situated in an ASIC, such as ASIC 5 in FIG. 2. PCM RF switches 6a, 6b, and 6c in FIG. 8A generally correspond to PCM RF switch 6 in FIG. 4 and may have any implementations and advantages described above.

Controller 37 provides general control over testing functions of circuit 54, as well as clocking and synchronization. In particular, controller 37 selects which of PCM RF switches 6a, 6b, and 6c will receive a crystallizing or an amorphizing electrical pulse, which type (a crystallizing or an amorphizing) the electrical pulse will be, and when to generate data for determining resistivity change of heating elements 9a, 9b, and 9c in PCM RF switches 6a, 6b, and 6c.

Pulsers 38 and 39 generate electrical pulses. Pulser 38 periodically generates amorphizing electrical pulses, such as amorphizing electrical pulse 21 in FIG. 6A. Pulser 39 periodically generates crystallizing electrical pulses, such as crystallizing electrical pulse 19 in FIG. 5A. Pulsers 38 and 39 can have digitally programmable amplitudes, pulse widths, and periods. In one implementation, the pulse widths and periods of pulsers 38 and 39 are chosen such that the delay between the falling edge of a pulse and the rising edge of a subsequent pulse is approximately one microsecond (1 µs). In one implementation, pulsers 38 and 39 have rise times and fall times of approximately ten nanoseconds (10 ns) or less. In the present implementation, pulsers 38 and 39 are illustrated as voltage pulsers. However, as used in the present application, a "pulser" encompasses and includes a voltage pulser, a current pulser, or any other type of pulser.

Enable/disable block 40 is coupled to pulsers 38 and 39, controller 37, and pulser line 42. Enable/disable block 40 enables or disables pulsers 38 and/or 39. Based on input received from controller 37 along pulser control bus 41, enable/disable block 40 can allow electrical pulses from only one of pulsers 38 and 39 at a time, and block electrical pulses from the other. When circuit 54 is providing amorphizing electrical pulses to PCM RF switches 6a, 6b, and 6c, enable/disable block 40 allows pulses from pulser 38 and blocks pulses from pulser 39. Conversely, when circuit 54 is providing crystallizing electrical pulses to PCM RF switches 6a, 6b, and 6c, enable/disable block 40 blocks pulses from pulser 38 and allows pulses from pulser 39. The allowed electrical pulses are output along pulser line 42. In one implementation, enable/disable block 40 comprises multiple pass transistors whose gates are coupled to pulser control bus 41.

Enable transistors 43a, 43b, and 43c selectively provide crystallizing and amorphizing electrical pulses to respective heating elements 9a, 9b, and 9c in respective PCM RF switches 6a, 6b, and 6c. As used in the present application, the term "enable transistor" refers to a transistor capable of selectively providing an electrical pulse, regardless of whether the electrical pulse is a voltage pulse, a current pulse, or any other type of electrical pulse. In the present implementation, enable transistors 43a, 43b, and 43c are shown as p-type fields effect transistors (PFETs). In other implementations, enable transistors 43a, 43b, and 43c can be any other type of transistor. The drains of enable transistors 43a, 43b, and 43c are coupled to pulser line 42. The sources of enable transistors 43a, 43b, and 43c are coupled to respective heater contacts 18a, 18b, and 18c of respective heating elements 9a, 9b, and 9c of respective PCM RF switches 6a, 6b, and 6c. Heater contacts 17a, 17b, and 17c are coupled to ground 45. The gates of enable transistors 43a, 43b, and 43c are coupled to enable control bus 44.

Based on input received from controller 37 along enable control bus 44, one of enable transistors 43a, 43b, and 43c can be selectively turned on, thereby providing crystallizing or amorphizing electrical pulses to a corresponding selected one of heating elements 9a, 9b, and 9c in PCM RF switches 6a, 6b, and 6c. For example, controller 37 can turn on enable transistor 43a to select heating element 9a in PCM RF switch 6a. If pulser line 42 is passing amorphizing electrical pulses from pulser 38, enable transistor 43a will provide an amorphizing electrical pulse to heating element 9a in PCM RF switch 6a at heater contact 18a. Heating element 9a will generate a heat pulse that transforms an active segment of PCM 12a into an amorphous phase, and PCM RF switch 6a will switch to an OFF state. PCM RF switch 6a will maintain an OFF state until enable transistor 43a provides heating element 9a with a crystallizing electrical pulse.

Subsequently, controller 37 can then turn off enable transistor 43a and turn on enable transistor 43b to select heating element 9b in PCM RF switch 6b, and transform the active segment of PCM 12b. Similarly, controller 37 can then turn off enable transistor 43b and turn on enable transistor 43c to select heating element 9c in PCM RF switch 6c, and transform the active segment of PCM 12c. In one implementation, controller 37 can synchronize enable control bus 44 with the periods of electrical pulses at pulser line 42 such that each of enable transistors 43a, 43b, and 43c is only enabled for the duration of one electrical pulse (i.e., such that a single one of heating elements 9a, 9b, or 9c is not provided with the same electrical pulse twice in a row). In one implementation, a dummy load can be coupled to pulser line 42 to keep current flowing when no enable transistors 43a, 43b, or 43c are enabled.

In practice, circuit 54 can include many more than the three PCM RF switches 6a. 6b, and 6c shown in FIG. 8A. For example, circuit 54 can have a total of one thousand (1,000) PCM RF switches corresponding to design 3 in FIG. 3. In one implementation, rather than using a single enable control bus 44 and one enable transistor per PCM RF switch, circuit 54 can include PCM RF switches arranged in an array, with one enable transistor per row and one enable transistor per column, along with a row enable control bus and a column enable control bus. In various implementations, circuit 54 can concurrently provide crystallizing and/or amorphizing pulses to multiple PCM RF switches at a time, for example, by using multiple sets of pulsers 38 and 39, or by using higher amplitude pulsers 38 and 39. In various implementations, heater contacts 17a, 17b, and 17c are not directly coupled to ground 45, and are coupled to intermediate components. In various implementations, PCM contacts 15a. 15b, 15c, 16a, 16b, and 16c can be coupled to ground 45, a steady DC voltage, or other test circuitry (not shown in FIG. 8A).

In addition to the circuitry described above for providing crystallizing and amorphizing electrical pulses to heating elements 9a, 9b, and 9c to switch PCM RF switches 6a, 6b, and 6c between OFF and ON states, circuit 54 in FIG. 8A includes circuitry for generating data for determining resistivity change of heating elements 9a, 9b, and 9c in PCM RF switches 6a, 6b, and 6c. As described above, this test circuitry is situated in an ASIC, such as ASIC 5 in FIG. 2.

Enable/disable block 47 is coupled to current source 48, controller 37, and pulser line 42. As used in the present application, the term "current source" refers to a power source, regardless of whether the power source is a current source, a voltage source, or any other type of power source; thus the term also encompasses a "voltage source." Enable/disable block 47 enables or disables current source 48. Based on input received from controller 37 along test current control line 46, enable/disable block 47 can allow a test current from current source 48, or can block a test current from current source 48. Because resistivity change of heating elements 9a, 9b, and 9c cannot be accurately determined while heating elements 9a, 9b, and 9c are actively generating heat pulses, controller 37 synchronizes test current control line 46 with pulser control bus 41, such that current source 48 is disabled when one of pulsers 38 or 39 is enabled.

When circuit 54 is providing amorphizing or crystallizing electrical pulses to heating elements 9a, 9b, and 9c, enable/disable block 47 blocks a test current from current source 48 while enable/disable block 40 allows electrical pulses from one of pulsers 38 or 39. Conversely, when circuit 54 is providing a test current to heating elements 9a, 9b, and 9c, enable/disable block 47 allows a test current from current source 48 while enable/disable block 40 blocks electrical pulses from pulsers 38 and 39. The allowed test current is output along pulser line 42. In one implementation, enable/disable block 47 comprises a pass transistor whose gate is coupled to test current control line 46. In one implementation, current source 48 can provide a ten milliampere (10 mA) test current to heating elements 9a, 9b, and 9c.

Enable transistors 43a, 43b, and 43c selectively provide test currents to respective heating elements 9a, 9b, and 9c in respective PCM RF switches 6a, 6b, and 6c. As used in the present application, the term "enable transistor" refers to a transistor capable of selectively providing test power, regardless of whether the test power is a test current, a test voltage, or any other type of test power. Based on input received from controller 37 along enable control bus 44, enable transistors 43a, 43b, and 43c can be selectively enabled, thereby providing a test current to a corresponding selected one of heating elements 9a, 9b, and 9c in PCM RF switches 6a, 6b, and 6c. For example, controller 37 can turn on enable transistor 43a to select heating element 9a in PCM RF switch 6a. Enable transistor 43a will provide a test current from current source 48 to heating element 9a in PCM RF switch 6a at heater contact 17a. The test current will propagate along a path from heater contact 18a, through heating element 9a, to heater contact 17a and to ground 45. As described below, this test current creates a voltage difference across heating element 9a, which circuit 54 uses to generate data for determining resistivity change of heating element 9a.

MUX 49 is coupled to heater contacts 17a, 17b, 17c, 18a, 18b, and 18c. MUX 49 is also coupled to enable control bus 44 and test current control line 46. Based on input received from controller 37, enable control bus 44, and test current control line 46, MUX 49 transfers voltages from a selected pair of heater contacts. In the present implementation, the same input received by enable/disable block 47 along test current control line 46 is also received by MUX 49. Thus, MUX 49 only selects a pair of heater contacts when current source 48 is enabled and passing a test current to pulser line 42. In the present implementation, the same input received by enable transistors 43a, 43b, and 43c along enable control bus 44 is also received by MUX 49. Thus, the pair of heater contacts selected by MUX 49 corresponds to the heating element selected by enable transistors 43a, 43b, and 43c. Continuing the above example, when enable transistor 43a selectively provides a test current to heating element 9a in PCM RF switch 6a, MUX 49 selectively transfers the voltages at corresponding heater contacts 17a and 18a. In one implementation, MUX 49 may receive input from controller 37 separate from enable control bus 44 and test current control line 46.

Differential amplifier 50 is coupled to MUX 49. MUX 49 outputs the transferred voltages to respective input terminals of differential amplifier 50. Differential amplifier 50 outputs a signal proportional to the difference between the voltages. Continuing the above example, when enable transistor 43a selectively provides a test current to heating element 9a in PCM RF switch 6a, this test current creates a voltage difference between heater contacts 17a and 18a, MUX 49 selectively transfers the voltages at heater contacts 17a and 18a, and differential amplifier 50 outputs a signal proportional to a voltage difference between heater contacts 17a and 18a. In various implementations, differential amplifier 50 can be an instrumentation amplifier, an operational amplifier, or any other type of differential amplifier. In one implementation, differential amplifier 50 has a fixed gain. In one implementation, differential amplifier 50 has a gain of approximately twenty five (25).

The signals output by differential amplifier 50 represent test data for determining resistivity change of heating elements 9a, 9b, and 9c in PCM RF switches 6a, 6b, and 6c. For example, where the value of a test current provided by current source 48 and the gain of differential amplifier 50 are both known, the resistance across heating element 9a can be extrapolated from the output of differential amplifier 50; the resistivity of heating element 9a can be extrapolated based on this resistance and the dimensions of heating element 9a. Moreover, if a subsequent output from differential amplifier 50 is compared with an initial output from differential amplifier 50, the change in resistivity (i.e., the resistivity change) can be determined.

It is noted that, while data for determining resistivity change is generated by circuit 54 situated in an ASIC, such as ASIC 5 in FIG. 2, the actual determination of resistivity change (including the extrapolation of resistivities and comparison between initial and subsequent resistivities) may either be performed in ASIC 5 itself, for example, by a micro-computer (not shown) in ASIC 5, or may be performed external to ASIC 5, for example, by an ATE after ASIC 5 has provided the data to an external probe coupled to the ATE.

ADC 51 is coupled to differential amplifier 50. ADC 51 converts the data for determining resistivity change from analog to digital form. It is noted that the power supplies for ADC 51, differential amplifier 50, current source 48, pulsers 38 and 39, and controller 37 may be provided by an external source, for example, through any of contact pads 4 in FIG. 2, or by a micro-battery or other energy conversion means in the ROIC itself.

Buffer 52 is coupled to ADC 51. Buffer 52 is configured to store data for determining resistivity change in circuit 54. Buffer 52 can be any memory element known in the art.

Circuit 54 in FIG. 8A can generate and store data for determining resistivity change each time a test current is provided to heating elements 9a, 9b, and 9c in PCM RF switches 6a. 6b, and 6c. For example, after controller 37 enables enable transistor 43a and circuit 54 generates and stores data for determining resistivity change of heating element 9a, controller 37 can then turn off enable transistor 43a and turn on enable transistor 43b to selectively provide a test current from current source 48 to heating element 9b. Circuit 54 can then generate and store data for determining resistivity change of heating element 9b. Similarly, controller 37 can then turn off enable transistor 43b and turn on enable transistor 43c to selectively provide a test current from current source 48 to heating element 9c. Circuit 54 can then generate and store data for determining resistivity change of heating element 9c. Thus, circuit 54 can generate and store data for determining resistivity change of each heating element in a ROIC.

Controller 37 can synchronize pulser control bus 41, test current control line 47, and enable control bus 44, such that circuit 54 generates data for determining resistivity change of heating elements 9a, 9b, and 9c after providing heating elements 9a, 9b, and 9c with amorphizing and crystallizing pulses. For example, in response to enable transistors 43a, 43b, or 43c providing amorphizing electrical pulses from pulser 38 to heating elements 9a, 9b, and 9c, enable/disable block 40 can then disable pulser 38 and enable pulser 39, and then enable transistors 43a, 43b, and 43c can provide crystallizing electrical pulses from pulser 39 to heating elements 9a, 9b, and 9c. Subsequently, enable/disable block 40 can then disable both pulsers 38 and 39, and enable/disable block 47 can then enable current source 48. Enable transistors 43a, 43b, and 43c can then provide a test current from current source 48 to PCM RF switches 6a, 6b, and 6c, and circuit 54 can generate data for determining resistivity change of heating elements 9a, 9b, and 9c.

In one implementation, the timing scheme of controller 37 is configured to account for the temperature coefficient of resistance (TCR) of heating elements 9a, 9b, and 9c. To compensate for TCR, the timing scheme of controller 37 is configured such that heating elements 9a, 9b, and 9c of PCM RF switches 6a, 6b, and 6c are given time to cool after being provided an electrical pulse before being provided a test current. In one implementation, the time delay between the end of an electrical pulse provided to any heating element and the start of a test current provided to the same heating element is at least ten microseconds (10 μs).

Controller 37 can arrange various other timing schemes regarding when circuit 54 provides amorphizing and crystallizing electrical pulses and when circuit 54 generates data for determining resistivity change. For example, data for determining resistivity change of heating elements 9a, 9b, and 9c can be generated after circuit 54 performs one (1) OFF/ON cycle for each PCM RF switch, after circuit 54 performs one thousand (1,000) OFF/ON cycles for each PCM RF switch, or after circuit 54 performs one million (1,000,000) OFF/ON cycles for each PCM RF switch. Data for determining resistivity change of heating elements 9a. 9b, and 9c can be generated at the end of an OFF/ON cycle or in the middle of an OFF/ON cycle. Data for determining resistivity change can be generated for all heating elements 9a, 9b, and 9c, or for only a select group of heating elements 9a, 9b, and 9c. In PCM RF switch designs having multiple heating elements, data for determining resistivity change of each heating element can be generated.

In one implementation, circuit 54 redundantly tests to eliminate sources error. For example, after generating data for determining resistivity change of heating elements 9a, 9b, and 9c, rather than proceeding to enable one of pulsers 38 and 39 and performing additional OFF/ON cycles, circuit 54 can generate data for determining resistivity change of heating elements 9a, 9b, and 9c again. Redundant data for determining resistivity change can be compiled and analyzed to account for noise or other random errors. In various implementations, redundant data can be averaged, or used to discard outliers.

It is noted that, while redundant data for determining resistivity change is generated by circuit 54 situated in an ASIC, such as ASIC 5 in FIG. 2, its actual compilation and analysis may either be performed in ASIC 5 itself, for example, by a micro-computer (not shown) in ASIC 5, or may be performed external to ASIC 5, for example, by an ATE after ASIC 5 has provided the data to an external probe coupled to the ATE.

In the present implementation, circuit 54 includes a single test current source 48 and a single differential amplifier 50. Thus, circuit 54 provides a test current to heating elements 9a, 9b, and 9c one at a time, and generates data for determining resistivity change of heating elements 9a. 9b, and 9c one at a time. In another implementation, circuit 54 can include multiple current sources and/or multiple differential amplifiers to concurrently generate data for determining resistivity change of heating elements 9a, 9b, and 9c. In one implementation, rather than using enable transistors 43a, 43b, and 43c to provide both electrical pulses and test currents, two sets of enable transistors can be used, the first set dedicated to providing electrical pulses to heating elements 9a, 9b, and 9c, and the second set dedicated to providing test currents to heating elements 9a, 9b, and 9c.

In this implementation, current source 48 may couple to the second set of enable transistors without coupling to enable/disable block 47 or pulser line 42, and a second enable control bus may couple controller 37 to the second set of enable transistors.

Using read out bus 53, buffer 52 is configured to provide data for determining resistivity change to external probes coupled to an ATE (not shown in FIG. 8A). In one implementation, read out bus 53 is a serial peripheral interface (SPI) implemented using contact pads 4 in FIG. 2. Read out bus 53 can be shared by multiple designs 3 in ROIC 2. For example, where circuit 54 in FIG. 8A supports one design 3 in FIG. 2, read out bus 53 can be coupled to another buffer in another circuit that supports another design 3. In one implementation, buffer 52 may read out data for determining resistivity change each time it is generated. In another implementation, buffer 52 may read out data for determining resistivity change after a fixed number of cycles. In yet another implementation, buffer 52 may read out data for determining resistivity change whenever buffer 52 reaches a storage limit, after which buffer 52 can be reset. Data for determining resistivity change read out from buffer 52 can also be combined with addressing information and/or other information provided by controller 37 to distinguish which PCM RF switches the data corresponds to, which cycles the data was generated after, and whether the data was generated in response to a crystallizing or an amorphizing electrical pulse (e.g., data generated for PCM RF switch number 968 on cycle number 262,395 after the amorphizing pulse).

Figure 8B:
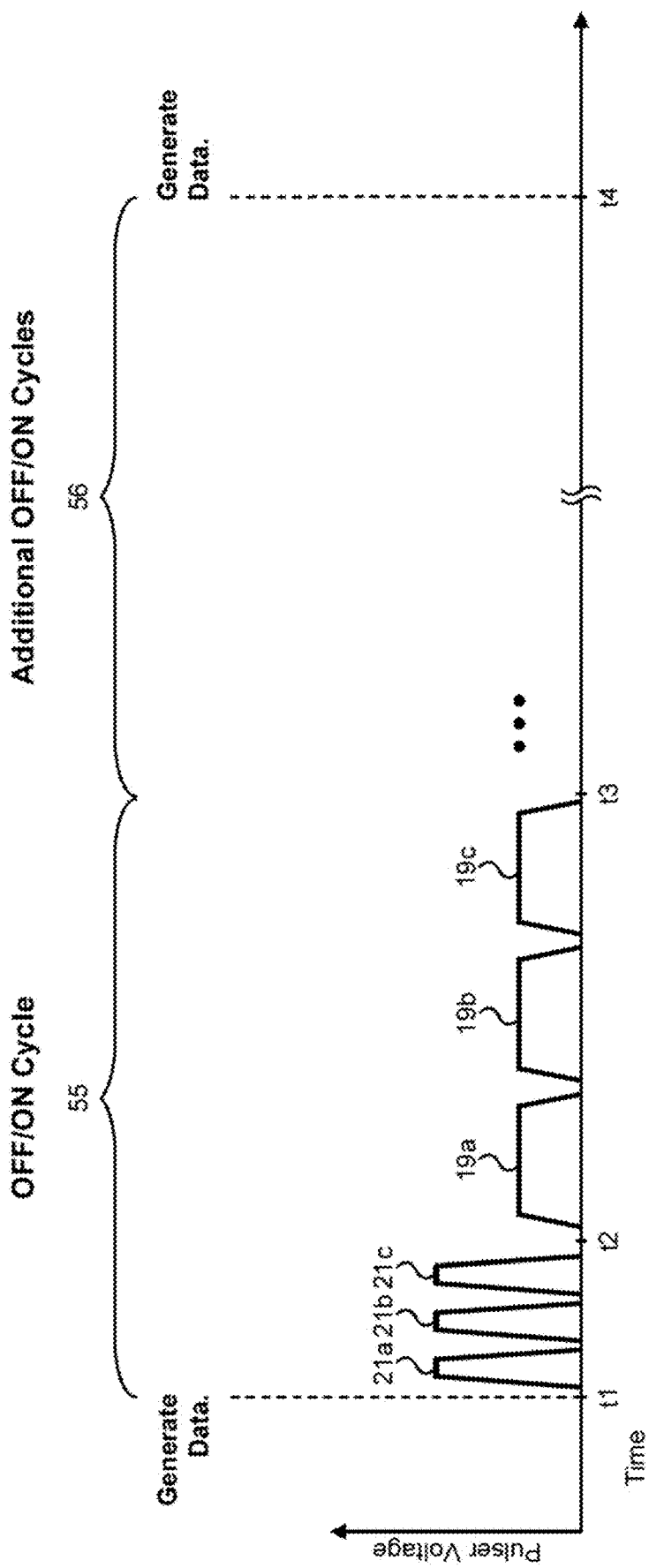
FIG. 8B illustrates an exemplary graph of pulser voltage versus time according to one implementation of the present application.

FIG. 8B illustrates an exemplary graph of pulser voltage versus time according to one implementation of the present application. The pulser voltage-time graph in FIG. 8B represents the voltage at a pulser line, such as pulser line 42 in FIG. 8A, plotted over time. Accordingly, the graph in FIG. 8B is described below with reference to circuit 54 in FIG. 8A. At time t1 in FIG. 8B, pulsers 38 and 39 are both disabled, current source 48 is enabled, and enable transistors 43a, 43b, and 43c are selectively enabled to provide a test current from current source 48 to heating elements 9a, 9b, and 9c in PCM RF switches 6a, 6b, and 6c. Differential amplifier 50 outputs signals proportional to voltage differences between heater contacts 17a and 18a, heater contacts 17b and 18b, and heater contacts 17c and 18c. Thus, circuit 54 generates data for determining resistivity change of heating elements 9a, 9b, and 9c. In one implementation, the time it takes for circuit 54 to generate data for resistivity change for a single heating element is approximately ten nanoseconds (10 ns).

At the end of time t1, after generation of data for determining resistivity change for the last heating element 9c, pulser 38 is enabled, and pulser 39 and current source 48 are both disabled. Amorphizing electrical pulses 21a, 21b, and 21c shown in FIG. 8B are sequentially applied by pulser line 42 in FIG. 8A. During amorphizing electrical pulse 21a in FIG. 8B, enable transistor 43a in FIG. 8A is enabled. Enable transistor 43a in FIG. 8A can be enabled prior to the start of amorphizing electrical pulse 21a in order to account for a turn-on time delay of enable transistor 43a. Enable transistor 43a in FIG. 8A can also be disabled prior to the end of amorphizing electrical pulse 21a in order to account for a turn-off time delay of enable transistor 43a. Similarly, during amorphizing electrical pulses 21b and 21c in FIG. 8B, enable transistors 43b and 43c in FIG. 8A are enabled respectively.

Amorphizing electrical pulses 21a, 21b, and 21c generally correspond to amorphizing electrical pulse 21 shown in FIG. 6A, and may have any implementations or advantages described above. For example, each of amorphizing electrical pulses 21a, 21b, and 21c can have a rise time of approximately ten nanoseconds (10 ns), a pulse width of approximately one hundred nanoseconds (100 ns), and a fall time of approximately ten nanoseconds (10 ns). In one implementation, the delay between the falling edge of amorphizing electrical pulse 21a and the rising edge of subsequent amorphizing electrical pulse 21b, as well as the delay between the falling edge of amorphizing electrical pulse 21b and the rising edge of subsequent amorphizing electrical pulse 21c, are each approximately one microsecond (1 μs).

As described above, in practice, circuit 54 in FIG. 8A will have many more than the three PCM RF switches 6a, 6b, and 6c. Accordingly, the graph in FIG. 8B may have more than three amorphizing electrical pulses 21a, 21b, and 21c between time t1 and time t2. Where circuit 54 includes one thousand (1,000) PCM RF switches, the total time between time t1 and time t2 can be approximately one thousand one hundred and thirty microseconds (1.130 μs).

At time t2, after provision of the last amorphizing electrical pulse 21c, pulser 39 is enabled, and pulser 38 and current source 48 are both disabled. Crystallizing electrical pulses 19a, 19b, and 19c shown in FIG. 8B are sequentially applied by pulser line 42 in FIG. 8A. During crystallizing electrical pulse 19a in FIG. 8B, enable transistor 43a in FIG. 8A is enabled. Enable transistor 43a in FIG. 8A can be turned on prior to the start of crystallizing electrical pulse 19a in order to account for a turn-on time delay of enable transistor 43a. Enable transistor 43a in FIG. 8A can also be turned off prior to the end of crystallizing electrical pulse 19a in order to account for a turn-off time delay of enable transistor 43a. Similarly, during crystallizing electrical pulses 19b and 19c in FIG. 8B, enable transistors 43b and 43c in FIG. 8A are turned on respectively.

Crystallizing electrical pulses 19a, 19b, and 19c generally correspond to crystallizing electrical pulse 19 shown in FIG. 5A, and may have any implementations or advantages described above. For example, each of crystallizing electrical pulses 19a, 19b, and 19c can have a rise time of approximately ten nanoseconds (10 ns), a pulse width of approximately one thousand nanoseconds (1,000 ns), and a fall time of approximately ten nanoseconds (10 ns). In one implementation, the delay between the falling edge of crystallizing electrical pulse 19a and the rising edge of subsequent crystallizing electrical pulse 19b, as well as the delay between the falling edge of crystallizing electrical pulse 19b and the rising edge of subsequent crystallizing electrical pulse 19c, are each approximately one microsecond (1 μs).

As described above, in practice, circuit 54 in FIG. 8A will have many more than the three PCM RF switches 6a, 6b, and 6c. Accordingly, the graph in FIG. 8B may have more than three crystallizing electrical pulses 19a, 19b, and 19c between time t2 and time t3. Where circuit 54 includes one thousand (1,000) PCM RF switches, the total time between time t2 and time t3 can be approximately two thousand and thirty microseconds (2,030 μs).

Continuing the above examples, the total time for OFF/ON cycle 55 (i.e., the time to switch one thousand (1,000) PCM RF switches in a single design 3 OFF and ON) can be approximately three thousand one hundred and sixty microseconds (3,160 μs). It is noted that, although OFF/ON cycle 55 in FIG. 8B corresponds to all PCM RF switches in a single design 3 being provided amorphizing and crystallizing electrical pulses, as used in the present application, an "OFF/ON cycle" refers to at least one PCM RF switch being provided an amorphizing electrical pulse and a crystallizing electrical pulse; thus the term also encompasses and includes an "ON/OFF cycle." The term does not require that all PCM RF switches in a single design 3 be cycled, does not require that a PCM successfully transform phases, and does not require that a PCM RF switch successfully turn OFF or ON.

After OFF/ON cycle 55, circuit 54 performs a plurality of additional OFF/ON cycles 56 from time t3 to time t4. Additional OFF/ON cycles 56 are similar to OFF/ON cycle 55. During OFF/ON cycles 56, circuit 54 alternates between providing amorphizing electrical pulses and crystallizing electrical pulses to PCM RF switches 6a, 6b, and 6c. Additional OFF/ON cycles 56 are performed so that heating elements 9a, 9b, and 9c repeatedly generate a significant number of amorphizing and crystallizing heat pulses and exhibit detectable resistivity change. In one implementation, one million (1,000,000) additional OFF/ON cycles 56 are performed. Continuing the above examples, the total time for additional OFF/ON cycles 56 (i.e., the time to switch one thousand (1,000) PCM RF switches in a single design 3 OFF and ON one million (1,000,000) times each) can be approximately 3,160 seconds, i.e., approximately fifty three minutes (53 min).

At time t4 in FIG. 8B, pulsers 38 and 39 are both disabled, current source 48 is enabled, and enable transistors 43a, 43b, and 43c are selectively turned on to provide a test current from current source 48 to heating elements 9a, 9b, and 9c in PCM RF switches 6a, 6b, and 6c. Differential amplifier 50 outputs signals proportional to voltage differences between heater contacts 17a and 18a, heater contacts 17b and 18b, and heater contacts 17c and 18c. Thus, circuit 54 generates data for determining resistivity change of heating elements 9a, 9b, and 9c.

The data generation operation at time t4 is similar to the data generation operation at time t1, except that the data generated at time t4 is more likely to exhibit increased resistivity change. In one implementation, the time it takes for circuit 54 to generate data for resistivity change for a single heating element is approximately ten nanoseconds (10 ns). In one implementation, the time delay between the end of an electrical pulse provided to any heating element and the start of a test current provided to the same heating element is at least ten microseconds (10 µs).

Continuing the above examples, the total time from time t1 to time t4 (i.e., the time to switch one thousand (1,000) PCM RF switches in a single design 3 through one million (1,000,000) OFF/ON cycles, generating initial and comparison data for determining resistivity change for each PCM RF switch) can be fifty three minutes (53 min). Since each design 3 is supported by its own circuit 54, all twenty designs 3 (shown in FIG. 2) can be cycled in parallel, and data for determining resistivity change for all twenty designs 3 can be detected in parallel. However, because there are significantly more PCM RF switches 6 than contact pads 4, the data is not necessarily read out from each circuit 54 in parallel. In one implementation, the time to read out the data for a single design 3 to external test probes of an ATE is approximately one millisecond (1 ms). The total time to read out the data for twenty designs 3 to external test probes of an ATE is approximately twenty milliseconds (i.e., 20 times 1 millisecond). Thus, the total time to complete one million cycles and read out for a ROIC, such as ROIC 2 in FIG. 2, is still approximately fifty three minutes (53 min).

In various implementations, circuit 54 generates data for determining resistivity change more often or less often than shown in FIG. 8B. For example, circuit 54 can generate data after every OFF/ON cycle. As another example, circuit 54 can generate data after one million OFF/ON cycles, and then generate data again after five hundred thousand OFF/ON cycles.

Figure 8C:
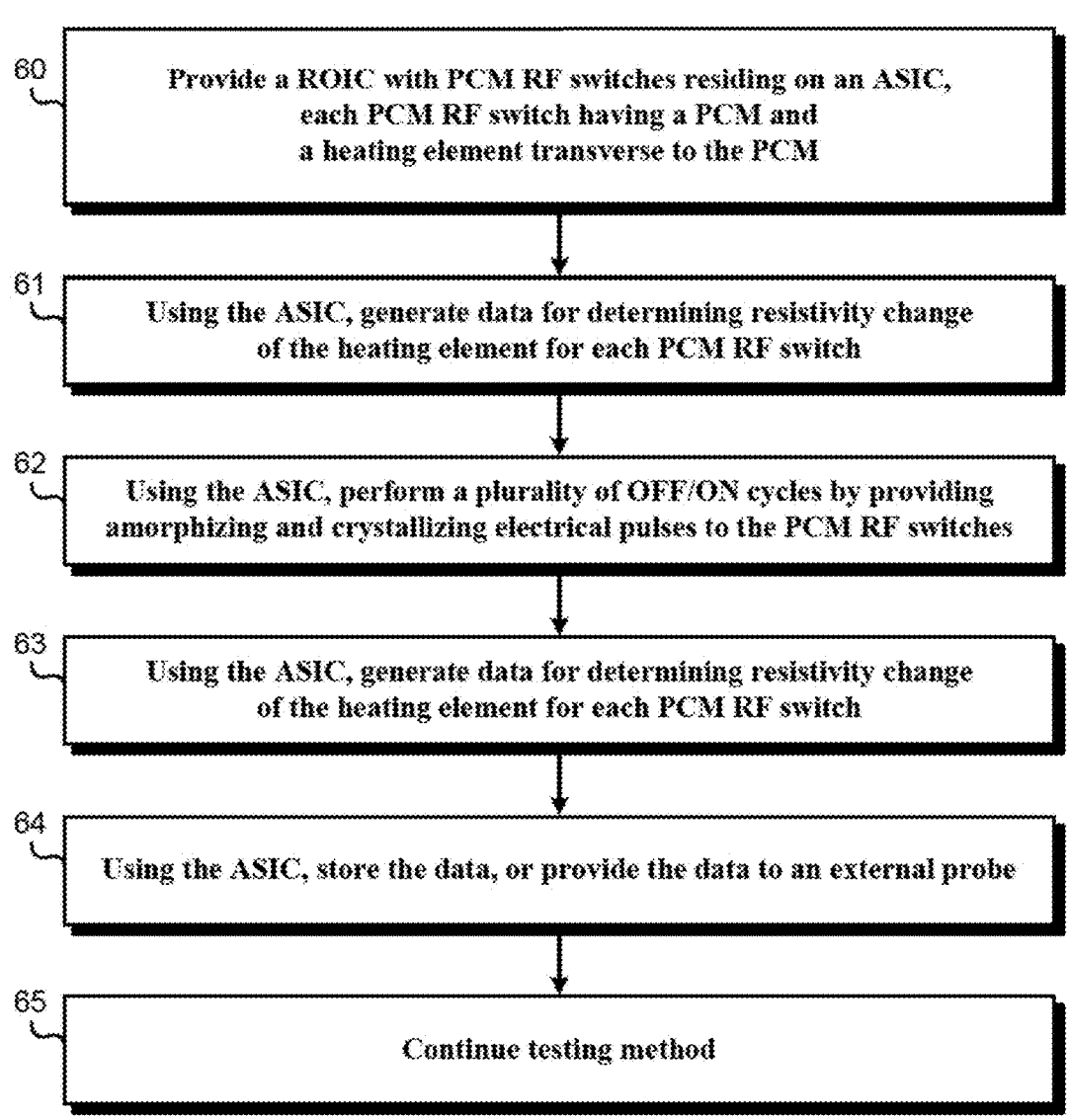
FIG. 8C illustrates a portion of a flowchart of an exemplary method for rapidly testing resistivity change of a heating element according to one implementation of the present application.

FIG. 8C illustrates a portion of a flowchart of an exemplary method for rapidly testing resistivity change of a heating element according to one implementation of the present application. Actions 60 through 65 shown in the flowchart of FIG. 8C are sufficient to describe one implementation of the present inventive concepts. Other implementations of the present inventive concepts may utilize actions different from those shown in the flowchart of FIG. 8C. Certain details and features have been left out of the flowchart of FIG. 8C that are apparent to a person of ordinary skill in the art. For example, an action may consist of one or more sub-actions or may involve specialized equipment or materials, as known in the art. Moreover, some actions are omitted so as not to distract from the illustrated actions.

The flowchart of FIG. 8C begins at action 60 by providing a ROIC with PCM RF switches residing on an ASIC, each PCM RF switch having a PCM and a heating element transverse to the PCM. The ROIC and ASIC can correspond to ROIC 2 and ASIC 5 in FIG. 2. The PCM RF switches can correspond to PCM RF switches 6a, 6b, and 6c in FIG. 8A.

The flowchart continues at action 61 by using the ASIC to generate data for determining resistivity change of the heating element for each PCM RF switch. A test current can be generated by a current source located in ASIC 5, such as current source 48 in FIG. 8A. The test current is provided to heater contacts of PCM RF switches 6a, 6b, and 6c, such as heater contacts 18a, 18b, and 18c in FIG. 8A. The test current can be selectively provided to PCM RF switches 6a, 6b, and 6c through enable transistors 43a, 43b, and 43c located in ASIC 5. A differential amplifier located in ASIC 5, such as differential amplifier 50, outputs signals proportional to voltage differences between heater contacts 17a and 18a, heater contacts 17b and 18b, and heater contacts 17c and 18c. Thus, circuit 54 generates data for determining resistivity change of heating elements 9a, 9b, and 9c.

The flowchart continues at action 62 by using the ASIC to perform a plurality of OFF/ON cycles by providing amorphizing and crystallizing electrical pulses to the PCM RF switches. The amorphizing electrical pulses can correspond to amorphizing electrical pulses 21a, 21b, and 21c in FIG. 8B. Amorphizing electrical pulses 21a, 21b, and 21c can be generated by a pulser located in ASIC 5, such as pulser 38 in FIG. 8A. The crystallizing electrical pulses can correspond to crystallizing electrical pulses 19a, 19b, and 19c in FIG. 8B. Crystallizing electrical pulses 19a, 19b, and 19c can be generated by a pulser located in ASIC 5, such as pulser 39 in FIG. 8A. Amorphizing electrical pulses 21a, 21b, and 21c and crystallizing electrical pulses 19a, 19b, and 19c are provided to heater contacts of PCM RF switches 6a, 6b, and 6c, such as heater contacts 18a, 18b, and 18c in FIG. 8A. Amorphizing electrical pulses 21a, 21b, and 21c and crystallizing electrical pulses 19a, 19b, and 19c can be selectively provided to heating elements 9a, 9b, and 9c in PCM RF switches 6a, 6b, and 6c through enable transistors 43a, 43b, and 43c located in ASIC 5. OFF/ON cycles are performed so that heating elements 9a, 9b, and 9c repeatedly generate to a significant number of amorphizing and crystallizing heat pulses and exhibit detectable resistivity change. In one implementation, one million (1,000,000) OFF/ON cycles are performed.

The flowchart continues at action 63 by using the ASIC to generate data for determining resistivity change of the heating element for each PCM RF switch. Action 63 is similar to action 61, except that action 63 occurs later in time. Action 63 generates data for determining resistivity change, which can be compared against data generated by action 61, for example, using an ATE, in order to quantify resistivity change.

The flowchart continues at action 64 by using the ASIC to store the data, or provide the data to an external probe. Data for determining resistivity change generated in both actions 61 and 63 can be stored using buffer 52 located in ASIC 5. Data for determining resistivity change generated in both actions 61 and 63 can also be provided to an external probe by reading out from buffer 52 using read out bus 53 located in ASIC 5. The external probe may be coupled to an ATE for receiving and analyzing test data generated by ROIC 2. In one implementation, ASIC 5 may read out data for determining resistivity change each time it is generated. In another implementation, ASIC 5 may read out data for determining resistivity change after a fixed number of cycles. In yet another implementation, ASIC 5 may read out data for determining resistivity change whenever buffer 52 reaches a storage limit, after which buffer 52 can be reset.

The flowchart concludes at action 65 by continuing the testing method. Action 65 can encompass various actions such as performing additional OFF/ON cycles, determining if any PCMs experienced significant resistivity change, analyzing test data generated by the ROIC using the ATE, etc.

Rapid testing ROICs according to the present invention are able to provide several advantages. First, because PCM RF switches 6 (shown in FIG. 3) reside on ASIC 5 (shown in FIG. 2), PCM RF switches 6 are integrated on the same chip as circuitry for programming and testing the PCM RF switches 6. Contact pads 4 (shown in FIG. 2) do not have to be used for receiving electrical pulses and test currents from external probes, and more contact pads 4 can be dedicated to reading out data generated by ROIC 4. Multiple contact pads 4 are also not required for each PCM RF switch 6, avoiding complexities in layout and fabrication. The proximity of PCM RF switches 6 and ASIC 5 also allows for connections with reduced contact resistances. Reduced contact resistances reduce power loss and increase the accuracy of resistivity change detection, particularly because long cables are not used to provide test currents, and their impedances do not need to be accounted for when extrapolating the resistivity of a heating element from the output of differential amplifier 50 (shown in FIG. 8A).

Second, because ROIC 2 includes enable transistors 43a, 43b, and 43c (shown in FIG. 8A) that provide amorphizing and crystallizing electrical pulses from pulser line 42 to selected PCM RF switches 6a. 6b, and 6c, ROIC 2 reduces testing time delays associated with PCM temperature and phase stabilization. Controller 37 can synchronize enable control bus 44 with the periods of electrical pulses at pulser line 42 such that each of enable transistors 43a, 43b, and 43c is only turned on for the duration of one electrical pulse. For example, enable transistor 43a can provide an electrical pulse to heating element 9a in PCM RF switch 6a, then enable transistor 43b can immediately provide another electrical pulse to heating element 9b in PCM RF switch 6b at the beginning of the next pulse period, and then enable transistor 43c can immediately provide another electrical pulse to heating element 9c in PCM RF switch 6c at the beginning of the next pulse period. It is not necessary to wait for the PCM of a PCM RF switch to cool and stabilize before providing the next electrical pulse. In one implementation, this avoids delays of approximately ten microseconds (10 µs) or more between each subsequent electrical pulse.

Third, because ROIC 2 includes two pulsers 38 and 39 and enable/disable block 40 (shown in FIG. 8A), ROIC 2 can reliably provide amorphizing and crystallizing electrical pulses to heating elements 9a, 9b, and 9c in PCM RF switches 6a, 6b, and 6c. Using a single programmable pulser generally cannot provide an amplitude range and a pulse width range to generate both amorphizing and crystallizing electrical pulses without significant performance tradeoffs, such as loss of accuracy, longer rise/fall times, and longer minimum periods. In ROIC 2, pulser 38 can be dedicated to generating amorphizing electrical pulses having higher amplitude and narrower pulse width, while pulser 39 can be dedicated to generating crystallizing electrical pulses having lower amplitude and wider pulse width.

Fourth, ROIC 2 flexibly generates data for determining resistivity change. Because each of heating elements 9a, 9b, and 9c in PCM RF switches 6a, 6b, and 6c (shown in FIG. 8A) can selectively couple to current source 48 through corresponding enable transistors 43a, 43b, and 43c, and because each pair of heater contacts 17a and 18a, 17b and 18b, and 17c and 18c can selectively transfer voltages to differential amplifier 50 through MUX 49, ROIC 2 supports degrees of control when testing numerous PCM RF switches. For example, data for determining resistivity change of heating elements 9a, 9b, and 9c can be generated after ROIC 2 performs one OFF/ON cycle, after ROIC 2 performs one thousand OFF/ON cycles, or after ROIC 2 performs one million OFF/ON cycles. Data for determining resistivity change can be generated for all of heating elements 9a, 9b, and 9c, or for only a select group of heating elements 9a, 9b, and 9c. Redundant data can be generated for heating elements 9a, 9b, and 9c to eliminate noise and other random test errors.

Fifth and finally, ROIC 2 enables generation of a statistically significant set of non-simulated test data at rapid speeds. ROIC 2 can perform enough OFF/ON cycles for heating element 9 (shown in FIG. 4) to exhibit detectable resistivity change. ROIC 2 can improve the accuracy of detection by mitigating the impact of TCR. ROIC 2 can test enough PCM RF switches 6 to confidently determine the average resistivity change and the variance in resistivity change for a given PCM RF switch design. In one implementation, the total time required for ROIC 2 to cycle twenty thousand (20,000) PCM RF switches 6 one million (1,000,000) OFF/ON cycles each, generate data for determining resistivity change for each heating element 9 in the PCM RF switches 6, and read out the data can be approximately fifty three minutes (53 min). Testing through these many cycles using conventional means, for example, by connecting external probes of an ATE to an individual PCM RF switch at a time, could take more than fifty years. Thus, ROIC 2 enables rapid testing that is several orders of magnitude faster than conventional means.

Thus, various implementations of the present application achieve a rapid testing ROIC, and utilize the inventive ASIC of the present application, to overcome the deficiencies in the art to significantly reduce test delays, increase test accuracy, and generate large sets of test data for determining and characterizing resistivity change of heating elements in PCM RF switches accurately and rapidly. From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the scope of those concepts. As such, the described implementations are to be considered in all respects as illustrative and not restrictive. It should also be understood that the present application is not limited to the particular implementations described above, but many rearrangements, modifications, and substitutions are possible without departing from the scope of the present disclosure.

The invention claimed is:

1. A rapid testing read out integrated circuit (ROIC) comprising:

phase-change material (PCM) radio frequency (RF) switches residing on an application specific integrated circuit (ASIC);
each said PCM RF switch comprising a PCM and a heating element transverse to said PCM;
said ASIC configured to provide amorphizing and crystallizing electrical pulses to a selected heating element in a selected PCM RF switch;
said ASIC configured to generate data for determining resistivity change of said selected heating element in said selected PCM RF switch after said ASIC performs a plurality of OFF/ON cycles.

2. The rapid testing ROIC of claim 1, wherein said data for determining resistivity change of said selected heating element corresponds to a voltage difference between first and second heater contacts of said selected PCM RF switch.

3. The rapid testing ROIC of claim 1, wherein said ROIC is configured to store said data for determining resistivity change of said selected heating element in said ASIC.

4. The rapid testing ROIC of claim 1, wherein said ROIC is configured to provide said data for determining resistivity change of said selected heating element to an external probe.

5. The rapid testing ROIC of claim 4, wherein said external probe is coupled to an automatic test equipment (ATE).

6. The rapid testing ROIC of claim 1, wherein said ASIC is configured to provide one of said amorphizing and crystallizing electrical pulses at a time.

7. The rapid testing ROIC of claim 1, wherein said ASIC comprises enable transistors configured to select said selected heating element.

8. The rapid testing ROIC of claim 1, wherein said ASIC is configured to provide a test current to said selected heating element.

9. A rapid testing read out integrated circuit (ROIC) comprising:
phase-change material (PCM) radio frequency (RF) switches residing on an application specific integrated circuit (ASIC);
each said PCM RF switch comprising a PCM and a heating element transverse to said PCM;
said ASIC configured to provide amorphizing and crystallizing electrical pulses to a selected heating element in a selected PCM RF switch, wherein a first heater contact of said selected PCM RF switch is coupled to a pulser through an enable transistor;
said ASIC configured to generate data for determining resistivity change of said selected heating element in said selected PCM RF switch after said ASIC performs a plurality of OFF/ON cycles, wherein said first heater contact of said selected PCM RF switch is coupled to a current source through said enable transistor.

10. The rapid testing ROIC of claim 9, wherein said ASIC is configured to disable said current source when said pulser is enabled.

11. The rapid testing ROIC of claim 9, wherein a second heater contact of said selected PCM RF switch is coupled to ground.

12. The rapid testing ROIC of claim 9, wherein said data for determining resistivity change of said selected heating element corresponds to a voltage difference between said first heater contact and a second heater contact of said selected PCM RF switch.

13. The rapid testing ROIC of claim 9, wherein said ROIC is configured to store said data for determining resistivity change of said selected heating element in said ASIC.

14. The rapid testing ROIC of claim 9, wherein said ROIC is configured to provide said data for determining resistivity change of said selected heating element to an external probe.

15. The rapid testing ROIC of claim 14, wherein said external probe is coupled to an automatic test equipment (ATE).

16. A read out integrated circuit (ROIC) comprising:
phase-change material (PCM) radio frequency (RF) switches and an application specific integrated circuit (ASIC);
said ASIC configured to provide amorphizing and/or crystallizing electrical pulses to a selected PCM RF switch;
said ASIC configured to generate data for determining resistivity change of a heating element in said selected PCM RF switch after said ASIC performs a plurality of OFF/ON cycles.

17. The ROIC of claim 16, wherein said data for determining resistivity change of said heating element corresponds to a voltage difference between first and second heater contacts of said selected PCM RF switch.

18. The ROIC of claim 16, wherein said ROIC is configured to store said data for determining resistivity change of said heating element in said ASIC.

19. The ROIC of claim 16, wherein said ROIC is configured to provide said data for determining resistivity change of said heating element to an external probe.

20. The ROIC of claim 19, wherein said external probe is coupled to an automatic test equipment (ATE).

* * * * *